United States Patent
Ibusuki et al.

(10) Patent No.: US 8,194,362 B2
(45) Date of Patent: *Jun. 5, 2012

(54) MAGNETORESISTIVE EFFECT DEVICE INCLUDING A NITRIDE UNDERLAYER, AN ANTIFERROMAGNETIC LAYER, A FIRST FERROMAGNETIC LAYER, A NONMAGNETIC LAYER AND A SECOND FERROMAGNETIC LAYER WHICH ARE MULTILAYERED IN THIS ORDER ON A SUBSTRATE, MAGNETIC HEAD INCLUDING THE SAME MAGNETORESISTIVE EFFECT DEVICE, AND INFORMATION STORAGE APPARATUS INCLUDING THE SAME MAGNETIC HEAD

(75) Inventors: Takahiro Ibusuki, Tokyo (JP); Masashige Sato, Atsugi (JP); Shinjiro Umehara, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 14 days.

This patent is subject to a terminal disclaimer.

(21) Appl. No.: 12/842,447

(22) Filed: Jul. 23, 2010

(65) Prior Publication Data

US 2010/0284103 A1 Nov. 11, 2010

Related U.S. Application Data

(63) Continuation of application No. PCT/JP2008/051426, filed on Jan. 30, 2008.

(51) Int. Cl.
 *G11B 5/39* (2006.01)
(52) U.S. Cl. .................. 360/324.11; 360/324.1

(58) Field of Classification Search .............. 360/324.1, 360/324.12, 324.2, 324.11
See application file for complete search history.

(56) References Cited

U.S. PATENT DOCUMENTS

| | | | |
|---|---|---|---|
| 6,542,342 B1 | 4/2003 | Hayashi et al. | |
| 6,950,290 B2 | 9/2005 | Hayashi et al. | |
| 7,372,673 B2 | 5/2008 | Hayashi et al. | |
| 7,495,434 B2 * | 2/2009 | Zimmer et al. | 324/252 |
| 8,018,759 B2 * | 9/2011 | Kano et al. | 365/158 |
| 2003/0035256 A1 | 2/2003 | Hayashi et al. | |
| 2005/0219772 A1 | 10/2005 | Hayashi et al. | |
| 2007/0070553 A1 * | 3/2007 | Tsunekawa et al. | 360/313 |
| 2008/0094886 A1 * | 4/2008 | Ranjan et al. | 365/171 |
| 2008/0232003 A1 * | 9/2008 | Ibusuki et al. | 360/324.11 |
| 2008/0278865 A1 * | 11/2008 | Tsunekawa et al. | 360/324.12 |

FOREIGN PATENT DOCUMENTS

| | | |
|---|---|---|
| JP | 2002-141583 | 5/2002 |
| JP | 2005-244254 | 9/2005 |
| JP | 2006-318983 | 11/2006 |
| JP | 2007-095750 | 4/2007 |

OTHER PUBLICATIONS

English translation of the Int'l. Preliminary Report on Patentability and Written Opinion issued in Int'l. App. No. PCT/JP2008/051426 Sep. 10, 2010.

* cited by examiner

*Primary Examiner* — Jefferson Evans
(74) *Attorney, Agent, or Firm* — Greer, Burns & Crain, Ltd.

(57) ABSTRACT

A magnetoresistive effect device includes an underlayer, an antiferromagnetic layer, a first ferromagnetic layer, a nonmagnetic layer, and a second ferromagnetic layer which are multilayered in this order on a substrate. The underlayer is formed of a metal nitride, and the antiferromagnetic layer is formed of an antiferromagnetic material including Ir and Mn.

10 Claims, 16 Drawing Sheets

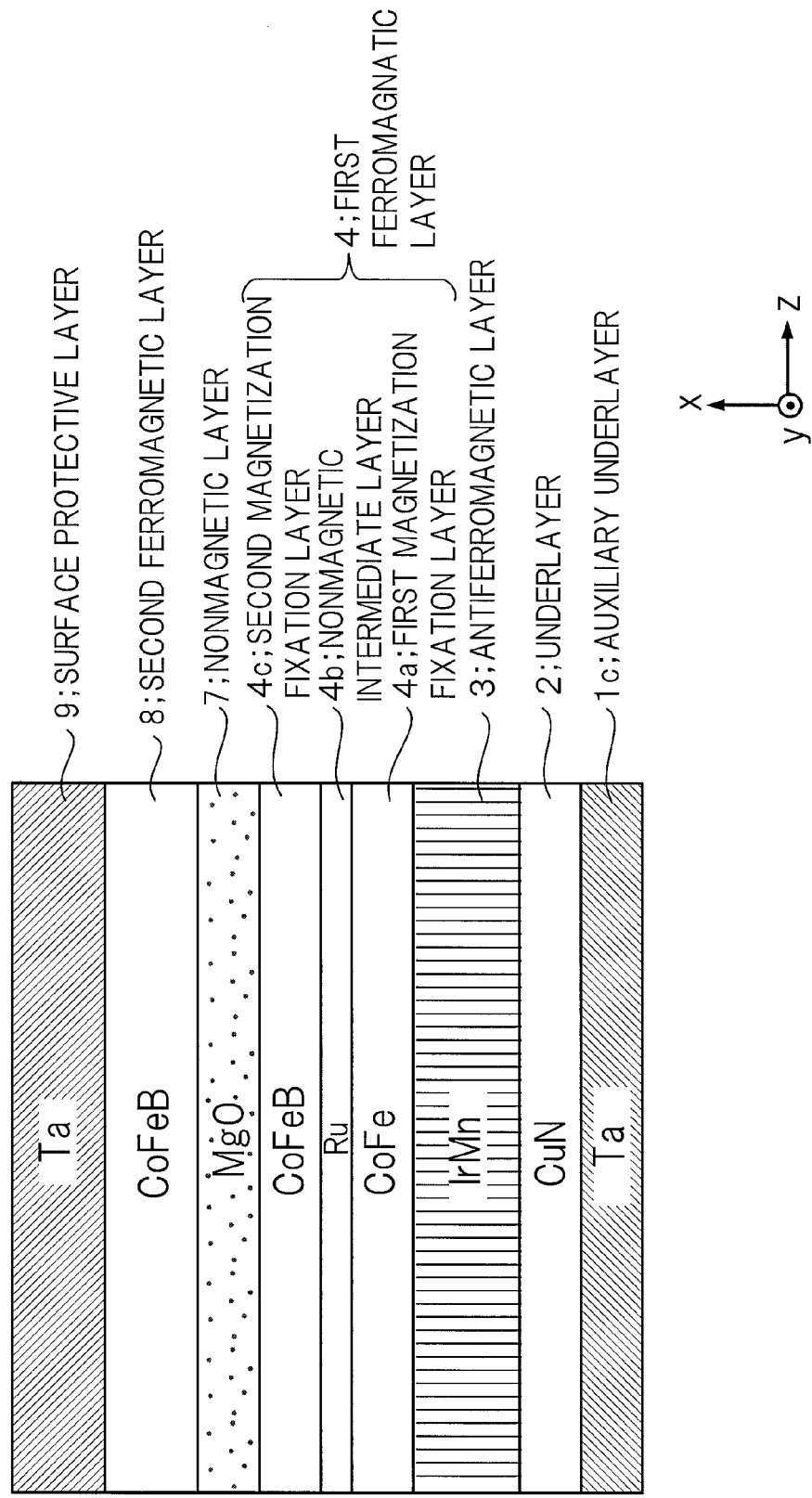

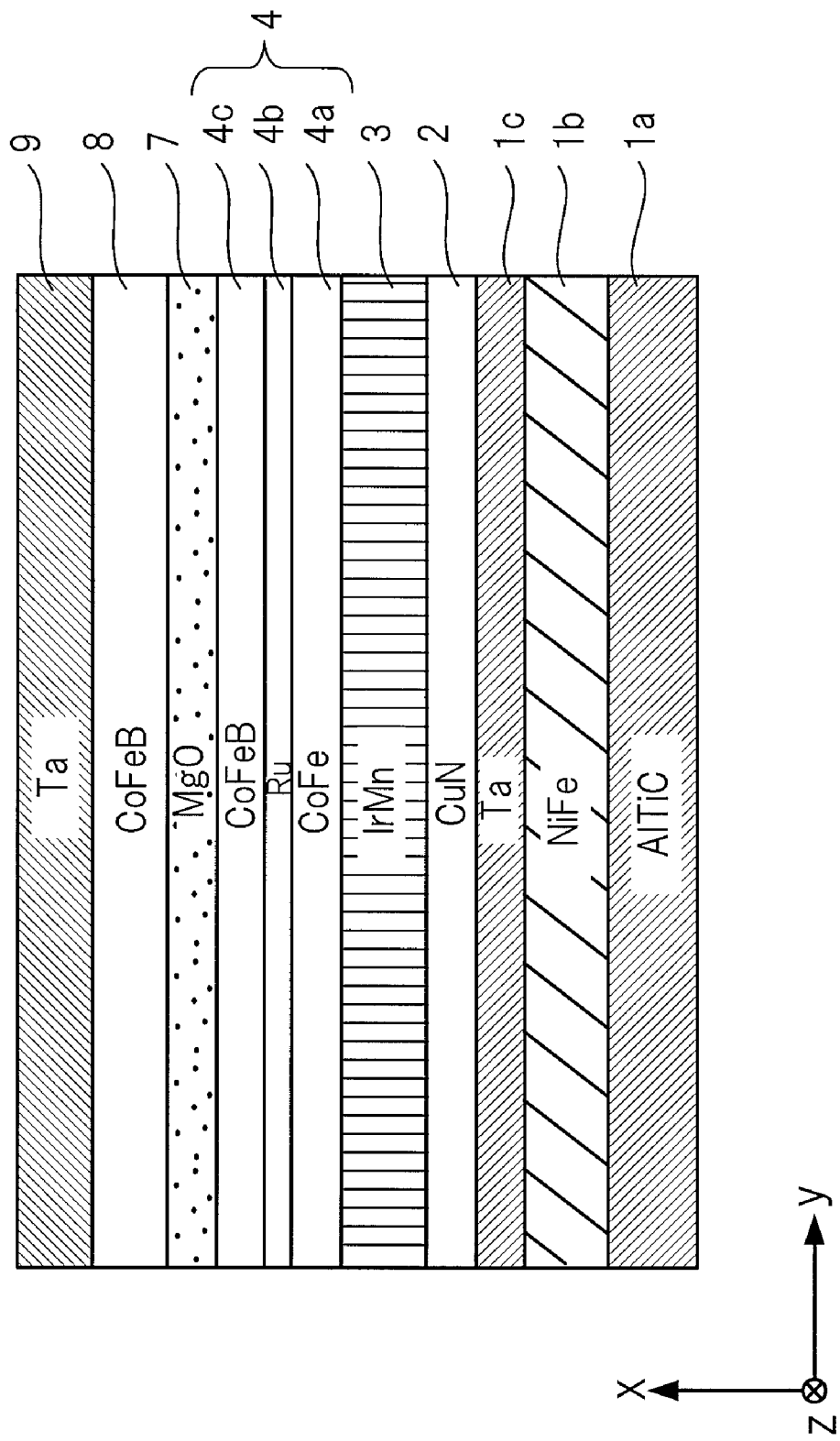

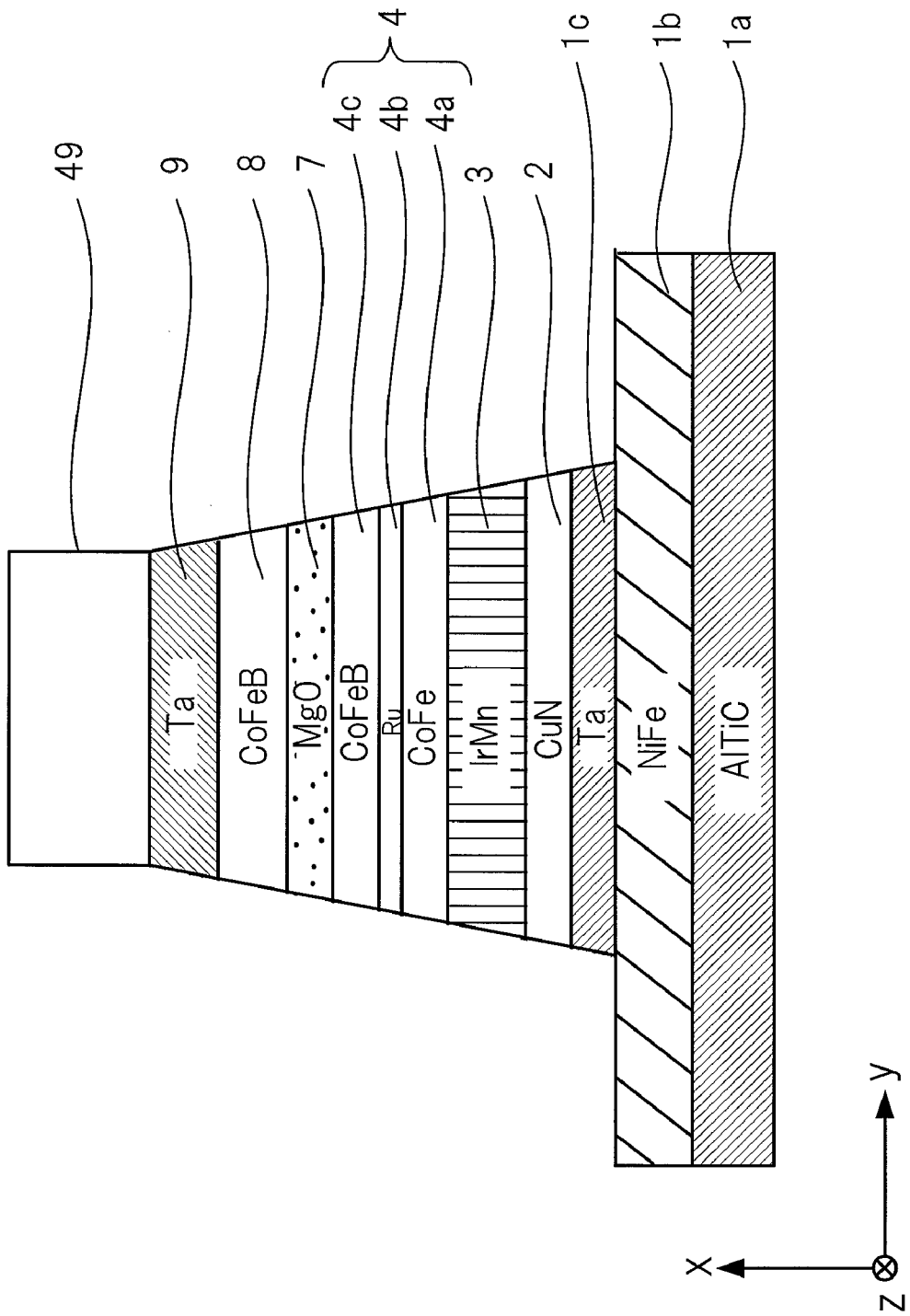

US 8,194,362 B2

MAGNETORESISTIVE EFFECT DEVICE INCLUDING A NITRIDE UNDERLAYER, AN ANTIFERROMAGNETIC LAYER, A FIRST FERROMAGNETIC LAYER, A NONMAGNETIC LAYER AND A SECOND FERROMAGNETIC LAYER WHICH ARE MULTILAYERED IN THIS ORDER ON A SUBSTRATE, MAGNETIC HEAD INCLUDING THE SAME MAGNETORESISTIVE EFFECT DEVICE, AND INFORMATION STORAGE APPARATUS INCLUDING THE SAME MAGNETIC HEAD

CROSS-REFERENCE TO RELATED APPLICATION

This is a continuation application of PCT/JP2008/051426, filed on Jan. 30, 2008.

TECHNICAL FIELD

The embodiment discussed herein is related to a magnetoresistive effect device in which an underlayer, an antiferromagnetic layer, a first ferromagnetic layer, a nonmagnetic layer, a second ferromagnetic layer are multilayered in this order on a substrate, a magnetic head having such a magnetoresistive effect device, and an information storage apparatus having such a magnetic head.

BACKGROUND ART

Recently, with the development of computer techniques, techniques related to a device that is incorporated in a computer and a peripheral device that is connected externally to a computer are rapidly progressed. In these techniques, the development of an information storage apparatus represented by a Hard Disk Drive (HDD) and a storage medium (storage reproducing medium) in which information is stored is especially active and various types of information storage apparatuses and storage media are currently on the market. As methods of storing information, a method of storing information by a combination of magnetization directions of plural pieces of magnetization under a rule of expressing 1 bit of information in a magnetization direction of one magnetization (parallel or antiparallel with respect to a predetermined direction) is conventionally widely known. In this method, in a storage area provided in a storage medium, information is recorded by forming magnetization in a direction according to an electric signal for recording (recording signal) representing information, and the information is reproduced by reading the direction of magnetization to generate an electric signal for reproduction (reproducing signal) representing the direction of magnetization. Therefore, in an information storage apparatus that employs this method, there are provided a recording device to form magnetization in a direction according to a recording signal and a reproducing device to generate a reproducing signal to represent the direction of magnetization.

Recently, a recoding density in a storage area becomes denser and a small reproducing device appropriate for reading information in such a high recording density is strongly desired. As a reproducing device appropriate for downsizing, there is known a reproducing device to read a direction of magnetization by utilizing a film called a magnetoresistive effect film. This magnetoresistive effect film has a layered structure sandwiching a nonmagnetic layer between two ferromagnetic layers. The magnetoresistive effect film has a property (magnetoresistive effect) that a magnitude of an electrical resistance to a current flowing between the two ferromagnetic layers via the nonmagnetic layer is different according to whether magnetization directions of the two ferromagnetic layers are in the parallel state to each other or in the antiparallel state to each other. The reproducing device that utilizes the magnetoresistive effect film electrically detects a change of an electrical resistance value between the two ferromagnetic layers according to a magnetization direction of each magnetization to read the magnetization direction. The method that utilizes the magnetoresistive effect has a simple mechanism of detecting a magnetization direction in comparison with a method that utilizes electromagnetic induction by a coil, so that downsizing of the reproducing device is achieved.

FIG. 1 is an external view illustrating surroundings of a reproducing device, in a magnetic head of a Hard Disk Device (HDD) that employs the reproducing device having a magnetoresistive effect film.

In FIG. 1, a reproducing device 104 is illustrated in a xyz-orthogonal coordinate system defined such that a surface of a magnetic disk 103 that rotates while closely approaching to the reproducing device 104 is set as a xy-plane, a direction of normal to the xy-plane is set as a z-axis, and a position of the reproducing device 104 is set as the origin. Here, the x-axis direction is a direction in which the reproducing device 104 moves relatively to the magnetic disk 103 and it is a circumference direction of the magnetic disk 103. The reproducing device 104 moves relatively to the direction of the x-axis, thereby sequentially approaching to 1 bit areas which are unit of storage areas aligned along each track (a circumference area with a constant radius) of the magnetic disk 103 and each of which has one magnetization representing 1 bit of information, and reads information. Here, each 1 bit area has a magnetization oriented in either a positive direction or a negative direction of the z-axis in FIG. 1.

As illustrated in FIG. 1, the reproducing device 104 includes two magnetic shield layers 100, 101 and a magnetoresistive effect film 102 arranged between these two magnetic shield layers 100, 101. Incidentally, as a constituent device of the reproducing device 104, in addition to the above-described magnetic shield layers 100, 101 and the magnetoresistive effect film 102, there are also a substrate serving as a supporting member to support them and a magnetic domain control film disposed between the magnetic shield layers 100, 101, and whose illustration is omitted here. In the reproducing device 104, an external magnetic field other than the magnetic field of the 1 bit area that most closely approaches to the magnetoresistive effect film 102 and that is targeted for reading the magnetization direction is shielded by the magnetic shield layers 100, 101. That is, only the magnetic field from the most closely approaching 1 bit area is detected by the magnetoresistive effect film 102. Here, the above-described nonmagnetic layer and the two ferromagnetic layers are built up in the magnetoresistive effect film 102 in the x-axis direction of FIG. 1. Next, a layer structure of the magnetoresistive effect film 102 will be explained.

FIG. 2 is a schematic diagram illustrating a layer structure of the magnetic effect film in FIG. 1.

The magnetoresistive effect film 102 has a layer structure such that an auxiliary underlayer 1c, an underlayer 2, an antiferromagnetic layer 3, a first ferromagnetic layer 4, a nonmagnetic layer 7, a second ferromagnetic layer 8, a surface protective layer are built up in this order on the magnetic shield layer 100 on the left side of FIG. 1. Here, the antiferromagnetic layer 3 has an antiferromagnetic property, the first ferromagnetic layer 4 and the second ferromagnetic layer 8 have a ferromagnetic property, and the nonmagnetic layer 7 is formed of a material whose magnetization ratio is remarkably small and hard to be magnetized. Further, the auxiliary underlayer 1c serves to increase adhesiveness between the underlayer 2 and the magnetic shield layer 100 of FIG. 1, and the underlayer 2 serves to fix the antiferromagnetic layer 3 to be smooth on the magnetic shield layer 100 on which the auxiliary underlayer 1c is built up. The surface protective layer 9 serves to protect a surface of the magnetoresistive effect film 102, and also contacts the magnetic shield layer 101 on the right side of FIG. 1.

In a state where a ferromagnetic layer and an antiferromagnetic layer contact with each other, as the first ferromagnetic layer 4 and the antiferromagnetic layer 3 illustrated in FIG. 2, it is known that, due to exchange coupling (a kind of magnetic interaction and it is an interaction between magnetizations) generated in a boundary surface between the ferromagnetic layer and the antiferromagnetic layer, a magnetization direction of the ferromagnetic layer is fixed so that the magnetization direction is still hard to be changed even receiving an influence of external magnetic field. FIG. 2 illustrates a state in which the magnetization direction of the first ferromagnetic layer 4 bordering the antiferromagnetic layer 3 is fixed in a direction of a rightward arrow in the diagram as an example. On the other hand, the second ferromagnetic layer 8 is away from the antiferromagnetic layer 3, so that the second ferromagnetic layer 8 is not such restricted as the first ferromagnetic layer 4 and the magnetization direction of the second ferromagnetic layer 8 is affected by the external magnetic fields and changed. Specifically, being affected by the magnetic field of 1 bit area approaching to the magnetoresistive effect film 102, the magnetization direction of the second ferromagnetic layer 8 in the magnetoresistive effect film 102 is changed. Here, due to the magnetoresistive effect, a magnitude of a resistance that a current flowing between the first ferromagnetic layer 4 and the second ferromagnetic layer 8 receives becomes small when the magnetization of the first ferromagnetic layer 4 and the magnetization of the second ferromagnetic layer 8 are in a state in which they are parallel to each other, and becomes large when the magnetization of the first ferromagnetic layer 4 and the magnetization of the second ferromagnetic layer 8 are in a state in which they are antiparallel to each other. By utilizing such property, the reproducing device 104 of FIG. 1 outputs a detection signal of the current flowing between the first ferromagnetic layer 4 and the second ferromagnetic layer 8 when a voltage is applied between these two ferromagnetic layers. By detecting a change in the current represented by this detection signal, the magnetization direction of each 1 bit area is detected.

In a read method that utilizes the magnetoresistive effect, in order that the magnetoresistive effect film 102 receives only an influence of a the magnetic field of a 1 bit area approaching to the magnetoresistive effect film 102, it is desired that a length of the magnetoresistive effect film 102 in the x-axis direction (read gap length "Lb" in FIG. 1) is approximately equal to or less than the length of the 1 bit area in the x-axis direction (bit length "Lb" in FIG. 1). Here, in order to improve a recording density of a magnetic disk, it is desirable to shorten the bit length, and therefore, in order to achieve a high recording density, it is desired that a reproducing device having a short read gap length that corresponds to the short bit length is obtained. Here, it is known that, in order to generate the exchange coupling enough for fixing the magnetization of the first ferromagnetic layer 4 between the antiferromagnetic layer 3 and the first ferromagnetic layer 4 contacting the antiferromagnetic layer 3, the thickness of the antiferromagnetic layer 3 is desired to be larger than a certain degree.

However, if the antiferromagnetic layer 3 is thickened, the read gap length Lrg of FIG. 1 also increases, so that it is hard to achieve a high recording density. Specifically, it has been an obstacle to achieve a high recording density that earlier than year 2003, as a material of the antiferromagnetic layer 3, an alloy of platinum (Pt) and manganese (Mn) or an alloy of lead (Pd), platinum (Pt) and manganese (Mn) are often employed. With these materials, the antiferromagnetic layer 3 is desired to have a layer thickness of 15 nm or more to generate sufficient exchange coupling for the first ferromagnetic layer 4 in the thickness of only several nm. Recently, there is reported that (see, for example, Japanese Laid-Open Patent Publication No. 2005-244254), if an alloy (hereafter abbreviated as Ir—Mn) of iridium (Ir) and manganese (Mn) is employed as a material of the antiferromagnetic layer 3, sufficient exchange coupling is generated in the antiferromagnetic layer 3 whose layer thickness is half or less (namely, 7.5 nm or less). In this way, by employing Ir—Mn as a material of the antiferromagnetic layer 3, it is possible to obtain a small reproducing device suitable for a high recording density.

As described above, the underlayer 2 serves to fix the antiferromagnetic layer 3 to be smooth on the magnetic shield layer 100 on which the auxiliary underlayer 1c is built up, and, as a material of the underlayer 2, an alloy formed by combining some of nickel (Ni), iron (Fe) and chrome (Cr), and a metal such as copper (Cu), ruthenium (Ru) and tantalum (Ta) have been conventionally used, also in Japanese Laid-Open Patent Publication No. 2005-244254.

However, if the antiferromagnetic layer 3 employing Ir—Mn is built up on the underlayer 2 formed of these materials, Ir—Mn is oriented in a [111] plane on the underlayer 2, so that a smooth film is not obtained. If the first ferromagnetic layer 4, the nonmagnetic layer 7 and the second ferromagnetic layer 8 are built up on the antiferromagnetic layer 3 whose surface is uneven, these built up layers also become layers lacking smoothness, and specifically because the nonmagnetic layer 7 is thin as compared to other layers, the nonmagnetic layer 7 is affected by the unevenness on a boundary surface of the antiferromagnetic layer 3 and tends to be a layer in a shape curling like a wave. If the nonmagnetic layer 7 becomes such a curled shape, the magnetic field of the first ferromagnetic layer 4 near the boundary surface of the nonmagnetic layer 7 affects a magnetization state of the second ferromagnetic layer 8, so that the responsiveness of the magnetization of the second ferromagnetic layer 8 to the magnetic field of the 1 bit area as the reading target is lowered. This interaction acting between the two ferromagnetic layers via the nonmagnetic layer is generally called Orange Peel effect. Furthermore, if the nonmagnetic layer 7 becomes a curled shape, when a voltage is applied between the first ferromagnetic layer 4 and the second ferromagnetic layer 8 and a current flows through, due to the decline of tolerance for the voltage, a breakage of the nonmagnetic layer 7 may occur. In this way, in a state where the responsiveness to an external magnetic field is low and the tolerance to the voltage is also low, the ability as the reproducing device is not fully exerted, and poses a problem.

When Ir—Mn is employed as a material of the antiferromagnetic layer in the magnetoresistive effect film, although there is an advantage that downsizing of a reproducing device is achieved, in order to utilize this advantage, a devise is desired to suppress that the antiferromagnetic layer becomes low in the smoothness.

Incidentally, in the above description, the reproducing device 104 that utilizes the magnetoresistive effect film 102 is described as a way of example. However, the above-described problem when Ir—Mn is employed as the material of the antiferromagnetic layer may also occur in a magnetoresistive effect device in general to detect a magnetization by utilizing the magnetoresistive effect film 102, other than the reproducing device. For example, this problem may also occur in a random access memory (RAM) that includes the plural magnetoresistive effect film 102 of FIG. 2 and stores information in form of magnetization directions of the plural second ferromagnetic layers 8.

DISCLOSURE OF INVENTION

According to an aspect of the invention, a magnetoresistive effect device includes an underlayer, an antiferromagnetic layer, a first ferromagnetic layer, a nonmagnetic layer, and a second ferromagnetic layer which are multilayered in this order on a substrate, wherein the underlayer is formed of a metal nitride, and the antiferromagnetic layer is formed of an antiferromagnetic material including Ir and Mn.

The object and advantages of the invention will be realized and attained by means of the devices and combinations particularly pointed out in the claims.

It is to be understood that both the foregoing general description and the following detailed description are exemplary and explanatory and are not restrictive of the invention, as claimed.

BRIEF DESCRIPTION OF DRAWINGS

FIG. 5 is a schematic diagram illustrating a layer structure of the magnetoresistive effect film in FIGS. 4A and 4B;

FIGS. 6A to 6C illustrate a state in each step until the reproducing device in FIGS. 4A and 4B is produced;

Figure 9:
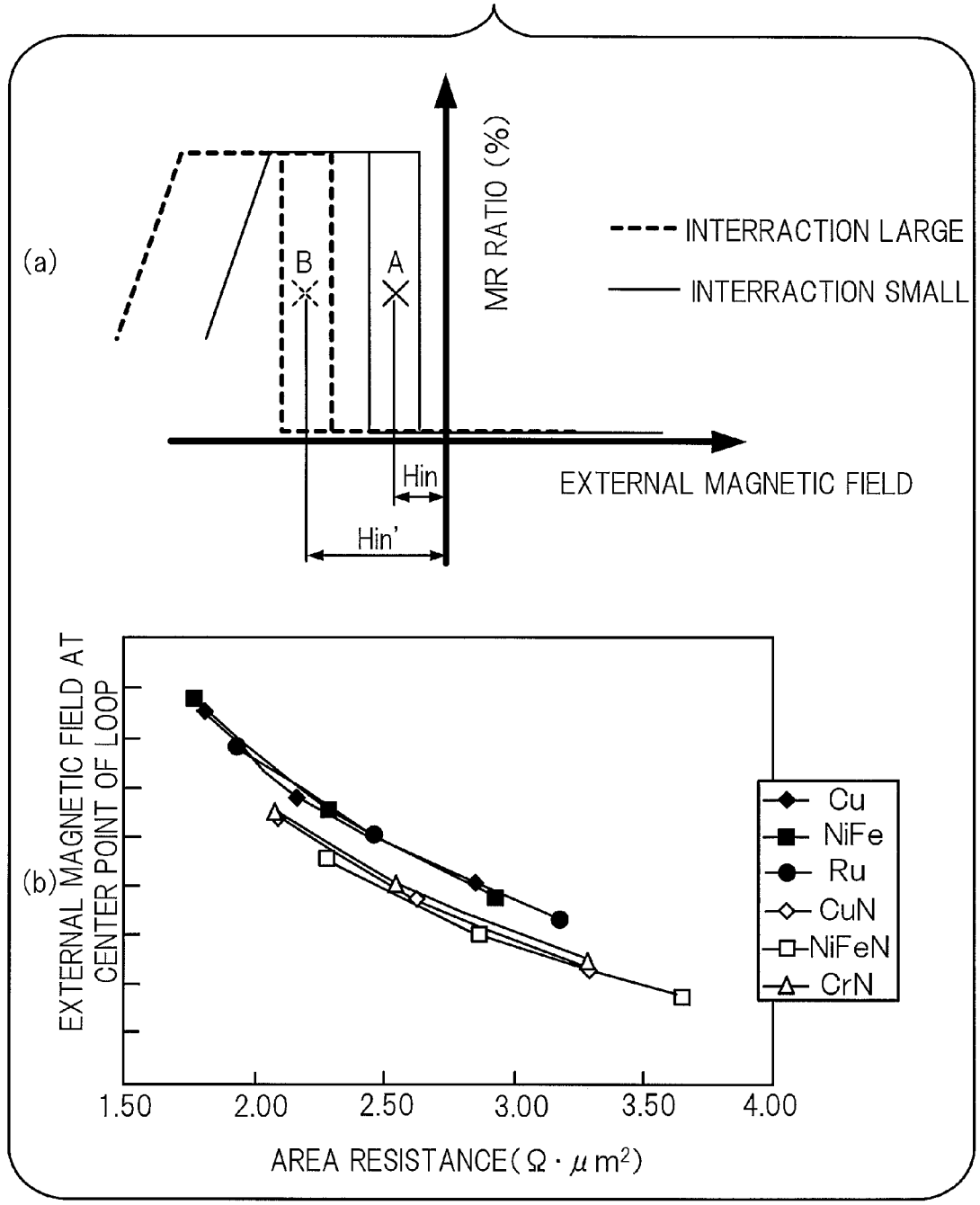
Figure 10B:
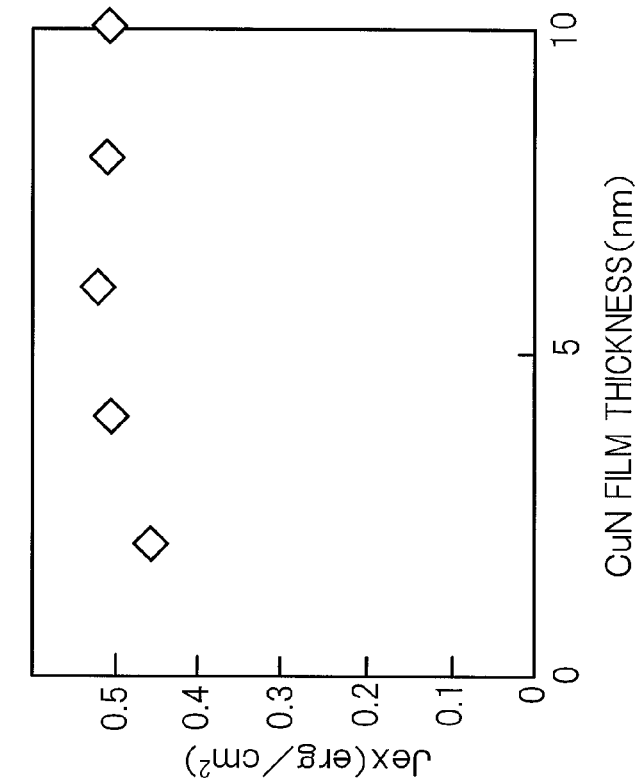
Figure 10A:
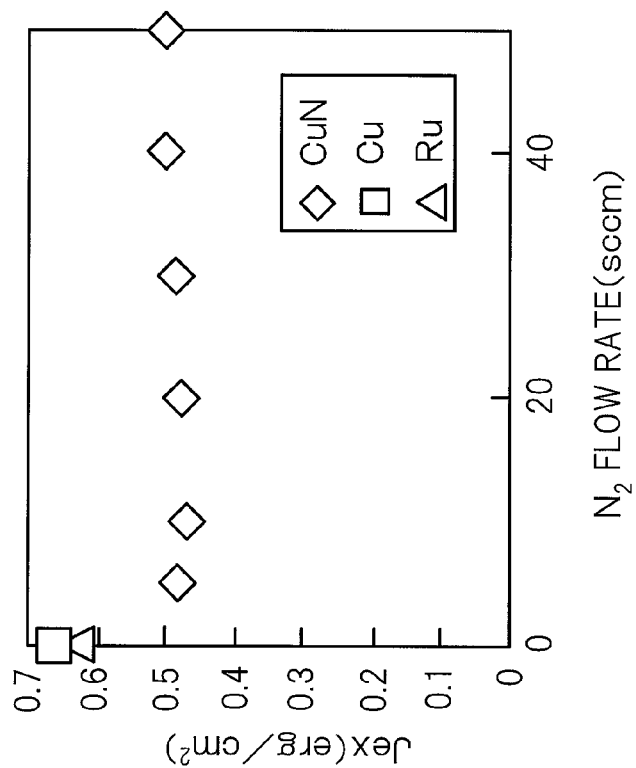
Figure 11:
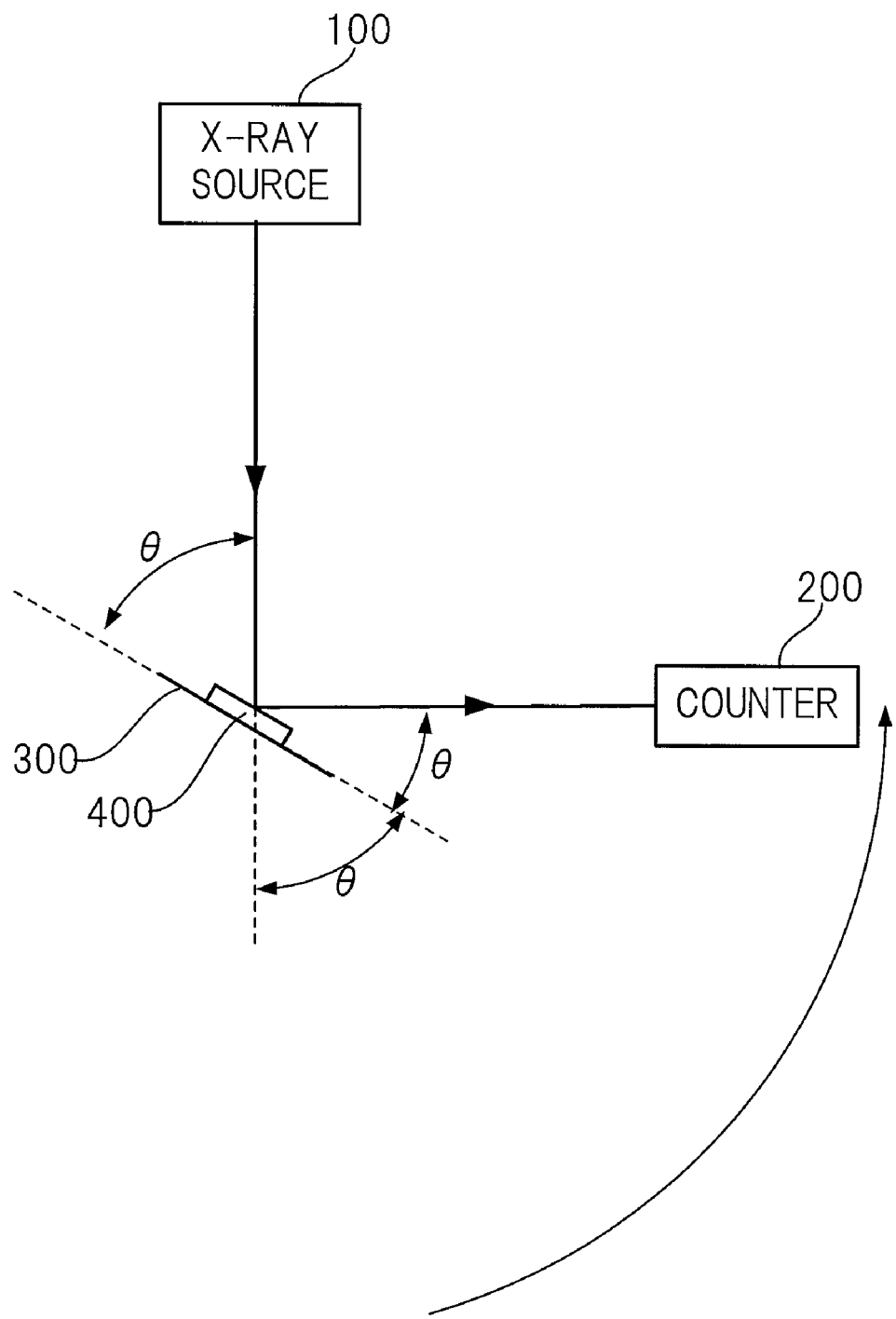
Figure 12:
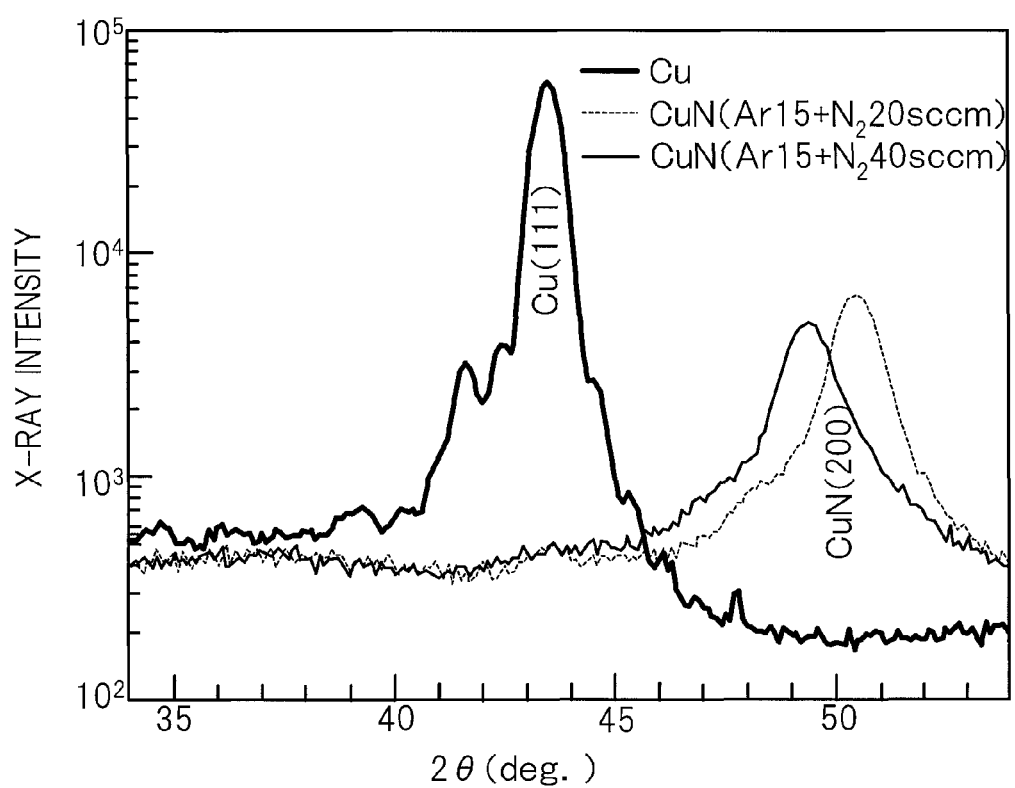
Figure 13:
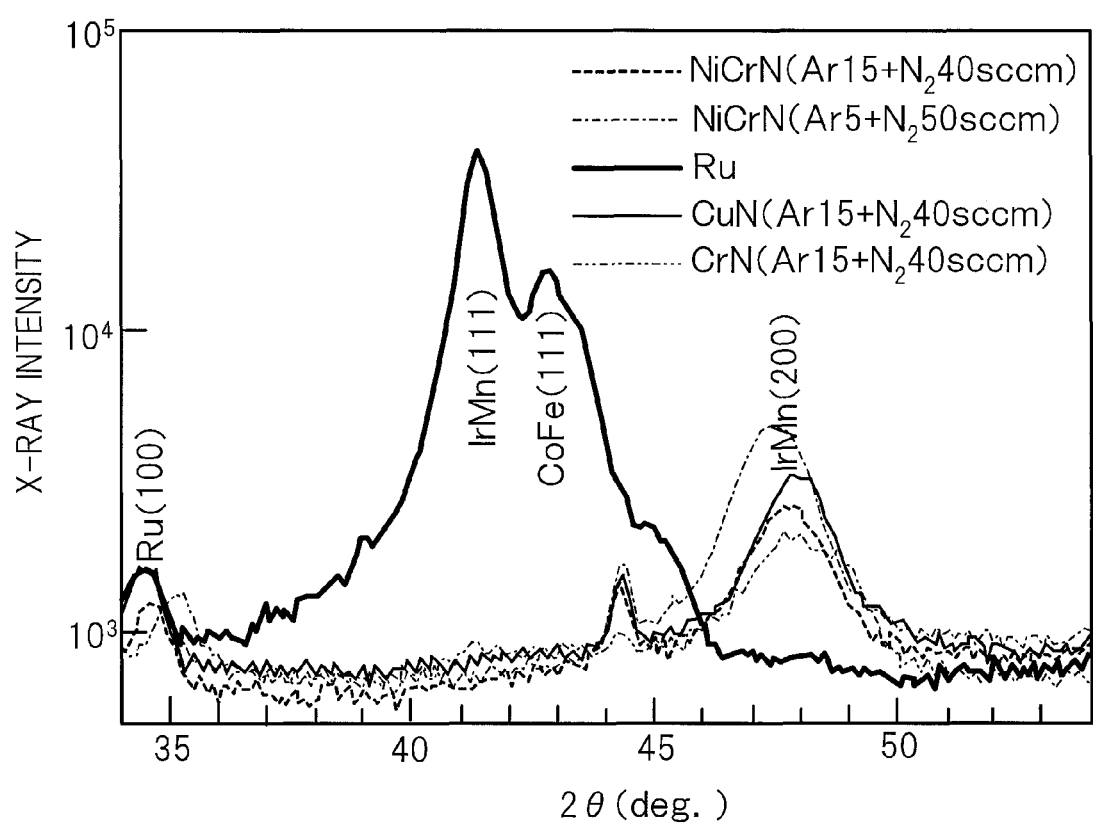

Parts (A) and (B) of FIG. 9 are diagrams explaining experiment 3;

FIGS. 10A and 10B are diagrams illustrating a result of experiment 4;

FIG. 11 is a diagram explaining an overview of an X-ray analysis;

FIG. 12 is a diagram illustrating a result of experiment 5;

FIG. 13 is a diagram illustrating a result of experiment 6; and

Figure 14:
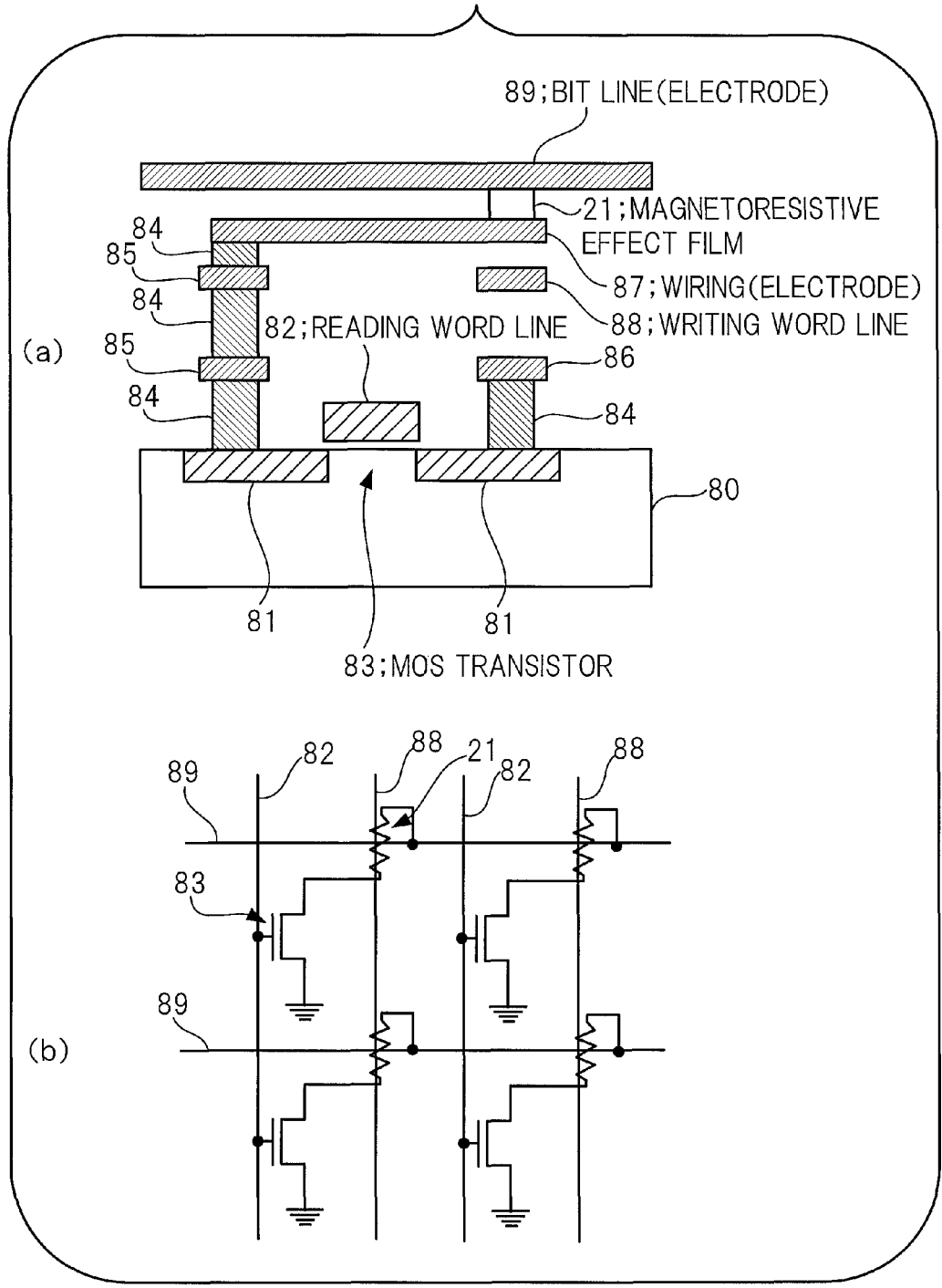

Parts (A) and (B) of FIG. 14 are diagrams illustrating a schematic structure of a MRAM having the magnetoresistive effect film in FIG. 5.

THE BEST MODE FOR CARRYING OUT THE INVENTION

Embodiments of the magnetoresistive effect device, the magnetic head, and the information storage apparatus whose basic modes (the application modes as well) are described above will be described with reference to the drawings.

Figure 3:
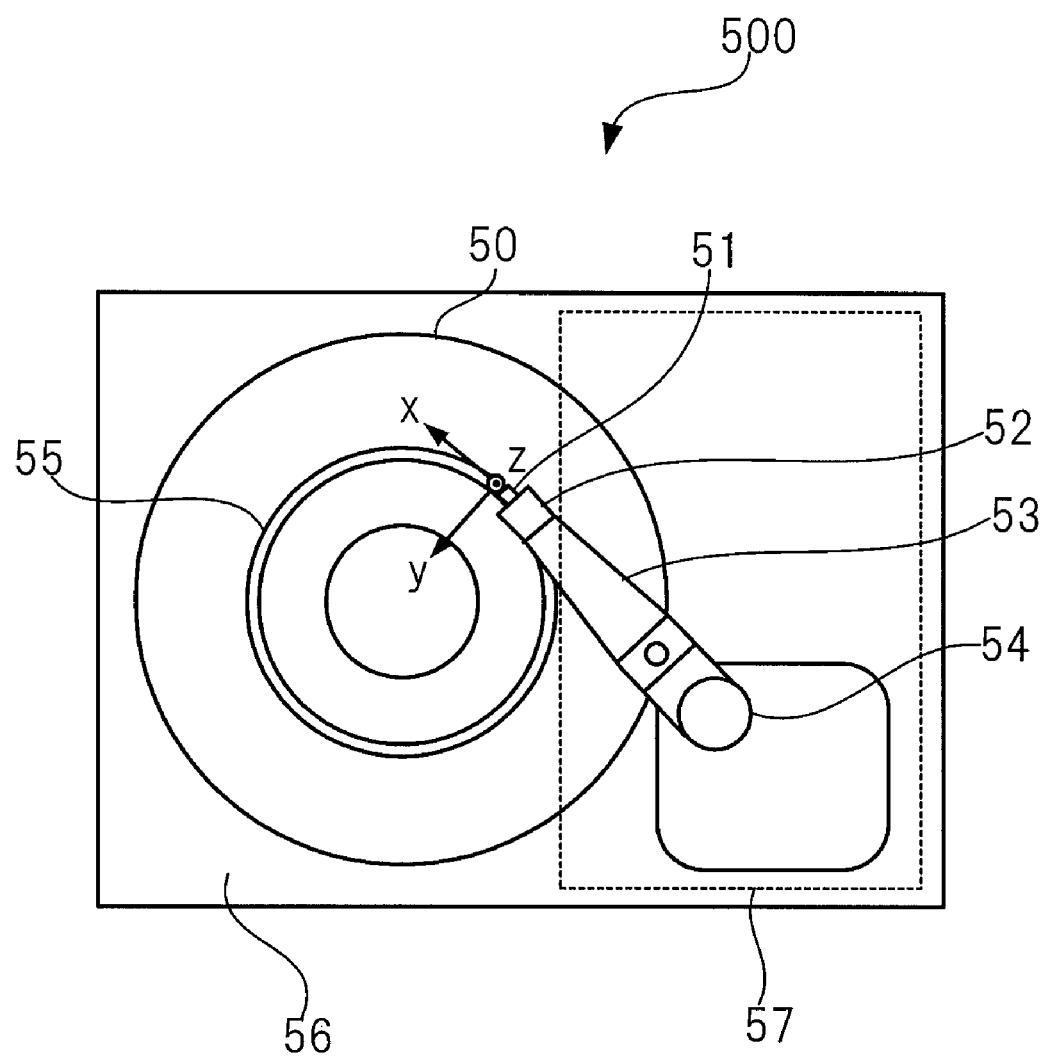
FIG. 3 is a diagram illustrating a magnetic disk apparatus that is an embodiment of the information storage apparatus.

FIG. 3 is a diagram illustrating a magnetic disk apparatus that is an embodiment of the information storage apparatus.

Ina magnetic disk apparatus 500 illustrated in FIG. 3, a rotary actuator 54 to generate a rotation drive force having a rotation axis in a direction perpendicular to the figure is provided. This rotary actuator 54 supports a suspension arm 53, and the suspension arm 53 receives the force of the rotary actuator 54 to move circularly about the rotary actuator 54 in a plane of the figure. At the tip of the suspension arm 53, a slider 52 is attached with a supporting tool called a gimbal, and further at the tip of the slider 52, a magnetic head 51 is attached.

The magnetic head 51 plays a role of reading information from a magnetic disk 50 and writing information to the magnetic disk 50. When reading or writing information, the suspension arm 53 is rotationally driven by the rotary actuator 54, so that the magnetic head 51 is placed at a position where the magnetic head 51 is floated by a small distance in height from a surface of the magnetic disk 50 having a disc-shape, and in this state, the magnetic head 51 reads information from the magnetic disk 50 and writes information to the magnetic disk 50. In FIG. 3, the magnetic head 51 is illustrated in a xyz orthogonal coordinate system defined such that the position of the magnetic head 51 is set as the origin, the surface of the magnetic disk 50 is set as a xy-plane, and the normal direction perpendicular to the figure is set as a z-axis. This definition of the coordinate system is the same as that of FIG. 1. On the surface of the disc-shaped magnetic disk 50, tracks 55 are concentrically provided in large numbers, and in the above-described xyz orthogonal coordinate system, the x-axis direction is a tangential direction of the tracks 55, and the y-axis direction is a widthwise direction of the tracks 55. In each of the tracks 55, unit storage areas each for storing information for 1 bit called 1 bit area are aligned along the track 55. In these 1 bit areas, a magnetization that is oriented in a positive direction or in a negative direction of the z-axis in the figure is provided one by one, and information for 1 bit is represented by these two directions. The magnetic disk 50 rotates in the plane of the figure with the center of the disc as a center of the rotation, and the magnetic head 51 placed near the surface of the magnetic disk 50 sequentially approaches each 1 bit area of the rotating magnetic disk 50.

In recording information, an electric recording signal is inputted into the magnetic head 51 approaching to the magnetic disk 50, and the magnetic head 51 applies a magnetic field to each 1 bit area according to the inputted recording signal and records information carried by the recording signal in the form of a magnetization direction of each 1 bit area. Furthermore, in reproducing information, the magnetic head 3 takes out the information recorded in the form of the magnetization direction in each 1 bit area by generating an electric reproducing signal according to a magnetic field generated from each magnetization. Here, after the magnetic head 51 reads information in one track 55, then the magnetic head 51 reads or writes information in other track 55, the suspension arm 53 that receives the rotating drive force of the rotary actuator 54 rotationally move the magnetic head 51 to a position close to the other track 55 and the magnetic head 51 reads or writes information in each 1 bit area of the other track 55 by the above-described method.

Each section that directly engages in storage and reproduction of information, such as the rotary actuator 54, the suspension arm 53, the slider 52, the magnetic head 51 and the like are housed in a base 56 along with the magnetic disk 50, and in FIG. 3, an inside of the base 56 is illustrated. On the backside of the base 56, a control board 57 having a control circuit to control the above-described each section is provided. The above-described each section is electrically connected with the control board 57 by a not-illustrated mechanism, and the recording signal inputted into the magnetic head 51 and the reproducing signal generated by the magnetic head 51 are processed in the control board 57. The control board 57 corresponds to an example of the signal processing board of the information storage apparatus.

Next, a structure of the magnetic head 51 will be explained in detail.

Figure 4A:
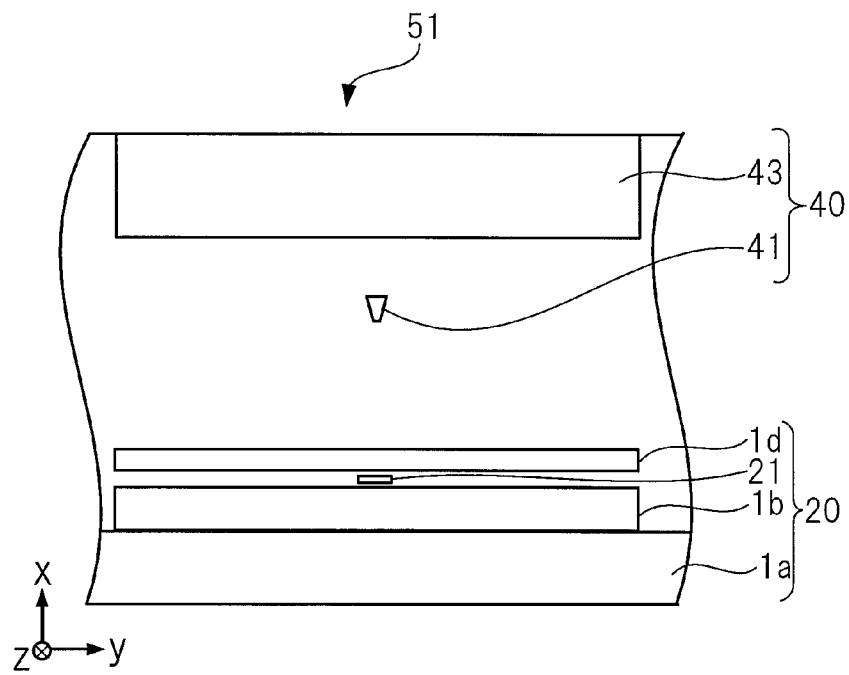
FIGS. 4A and 4B are diagrams illustrating the magnetic head in FIG. 3.
Figure 4B:
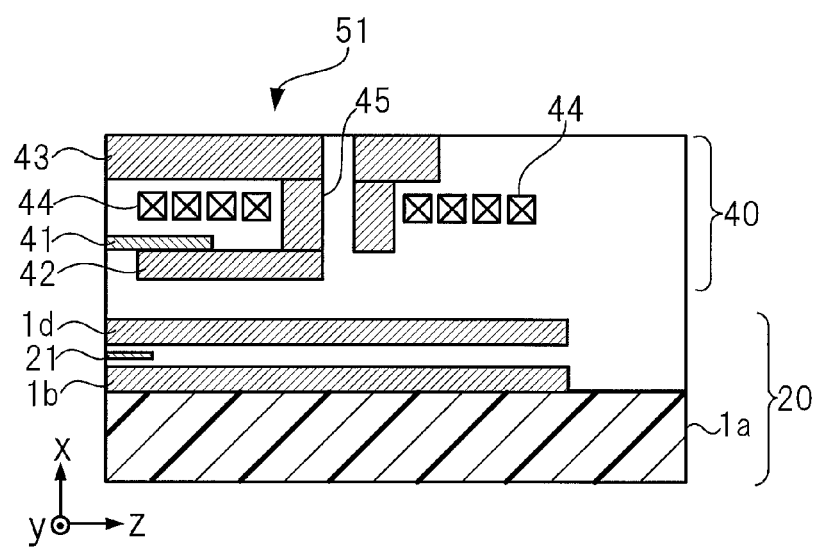

FIGS. 4A and 4B are diagrams illustrating the magnetic head 51 in FIG. 3.

FIG. 4A is a diagram illustrating the magnetic head 51 in a plane parallel to the xy-plane of FIG. 3, and FIG. 4B is a diagram illustrating the magnetic head 51 in a plane parallel to the xz-plane of FIG. 3.

The magnetic head 51 is provided with two devices; a recording device 40 to record information in the form of a magnetization direction by applying a magnetic field to each 1 bit area according to a recording signal at the time of recording information, and a reproducing device 20 to generate an electric reproducing signal to represent information according to a magnetic field generated from the magnetization of each 1 bit area at the time of reproducing information.

The recording device 40 is a device having a main magnetic pole 41, a main magnetic pole auxiliary layer 42, an auxiliary magnetic pole 43, and a joint section 45. Here, the main magnetic pole 41, the main magnetic pole auxiliary layer 42, the auxiliary magnetic pole 43, and the joint section 45 form a part of a magnetization path for a magnetic flux occurring at the time of recording magnetization. A thin film coil 44 for recording is disposed so as to interlink the magnetization path. The recording device 40 having such a structure may be produced by a known method.

The reproducing device 20 is a device to reproduce information by utilizing Tunnel Magnetoresistance Effect (TMR effect), and is provided with a lower magnetic shield layer 1b, a magnetoresistive effect film 21, an upper magnetic shield layer 1d, and a support substrate 1a.

The support substrate 1a is a support member to support the lower magnetic shield layer 1b, the magnetoresistive effect film 21, and the upper magnetic shield layer 1d. The support substrate 1a is a substrate (AlTiC substrate) in which an aluminum oxide film is formed on a surface of a nonmagnetic material including aluminum oxide ($Al_2O_3$) and carbonized titanium (TiC). In the reproducing device 20, the lower magnetic shield layer 1b is layered on the surface of the support substrate 1a.

Figure 1:
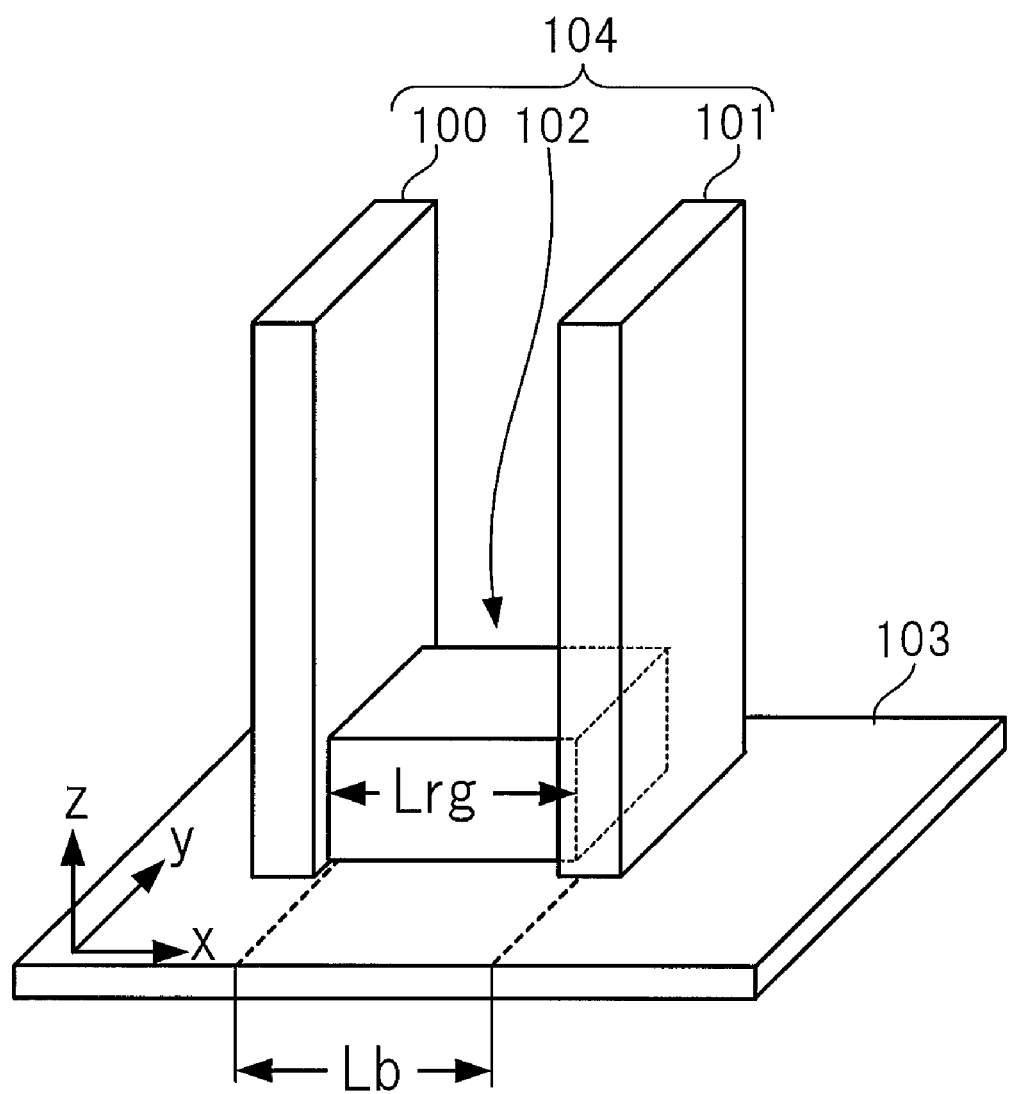
FIG. 1 is an external view illustrating surroundings of a reproducing device, in a magnetic head of a hard disk device (HDD) that employs the reproducing device having a magnetoresistive effect film.

The view of the lower magnetic shield layer 1b, the magnetoresistive effect film 21 and the upper magnetic shield layer 1d is identical to the one illustrated in FIG. 1. The lower magnetic shield layer 1b and the upper magnetic shield layer 1d are formed of an alloy (Ni—Fe) of nickel (Ni) and iron (Fe), and the layers have the thickness of approximately 2 to 3 nm and have a great magnetic permeability.

Incidentally, as a material of the lower magnetic shield layer and the upper magnetic shield layer, a material other than Ni—Fe may be employed as long as the material has a great magnetic permeability.

Next, the magnetoresistive effect film 21 will be explained.

FIG. 5 is a schematic diagram illustrating a layer structure of the magnetoresistive effect film in FIGS. 4A and 4B.

Figure 2:
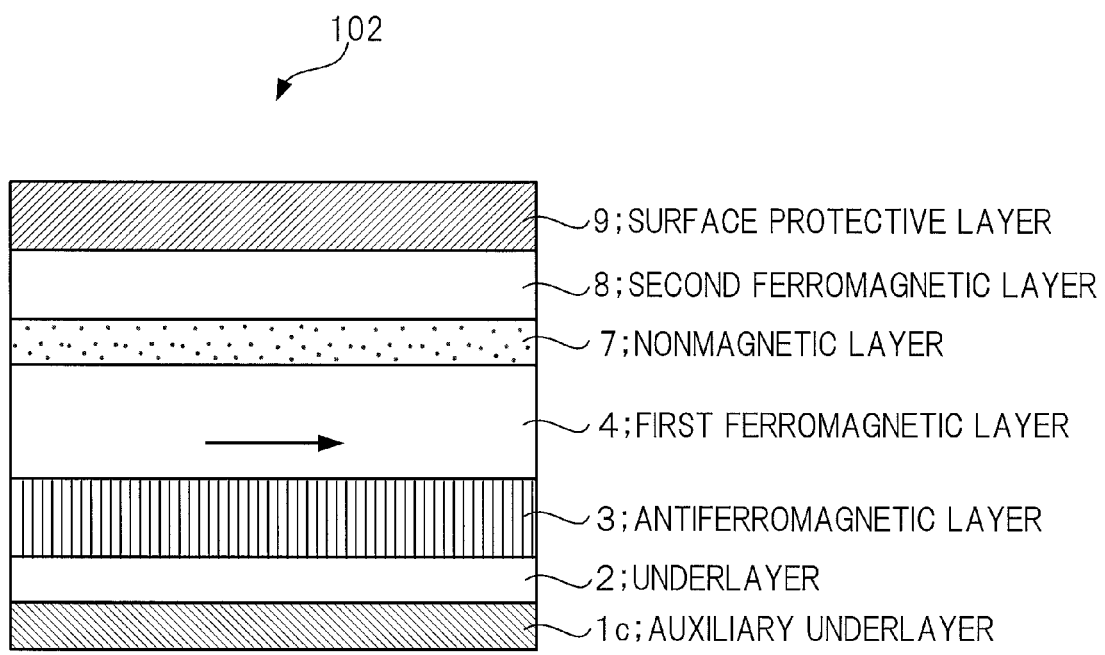
FIG. 2 is a schematic diagram illustrating a layer structure of the magnetoresistive effect film in FIG. 1.

As illustrated in FIG. 5, the magnetic effect film 21 has a layer structure such that an auxiliary underlayer 1c, an underlayer 2, an antiferromagnetic layer 3, a first ferromagnetic layer 4, a nonmagnetic layer 7, a second ferromagnetic layer 8, and a surface protective layer 9 are layered in this order on the lower magnetic shield layer 1b of FIG. 4B. The role each layer plays is the same as that explained in FIG. 2, and also in the magnetic effect film 21 of FIG. 4, an alloy material (Ir—Mn) of iridium (Ir) and manganese (Mn) is employed as the material of the antiferromagnetic layer 3. However, differently from a conventional magnetic effect film, in the magnetic effect film 21 of FIG. 4, the underlayer 2 is formed of a material including nitride copper (CuN), and thus this point is greatly different from the conventional magnetic effect film. The effect of employing nitride copper (CuN) as the material of the underlayer 2 will be described later, and firstly in the following, details of each layer in the magnetic effect film 21 of FIG. 4 will be explained.

The auxiliary underlayer 1c is a layer formed of a material including tantalum (Ta), and it is a layer having an amorphous structure. The underlayer 2 is a layer formed of a material including nitride copper (CuN) as described above. A sum of the layer thickness of the auxiliary underlayer 1c and the layer thickness of the underlayer 2 is, for example, around 5 nm.

The antiferromagnetic layer 3 is a layer of antiferromagnetic property that is made of the alloy material (Ir—Mn) of iridium (Ir) and manganese (Mn) as described above, and the layer thickness is, for example, around 7 nm.

The first ferromagnetic layer 4 is a layer in which three layers: a first magnetization fixation layer 4a of ferromagnetic property formed of a material (Co—Fe) including cobalt (Co) and iron (Fe); a nonmagnetic intermediate layer 4b formed of a material including ruthenium (Ru) and having an extremely small magnetization ratio; and a second magnetization fixation layer 4c of ferromagnetic property formed of a material (Co—Fe—Br) including cobalt (Co), iron (Fe) and boron (B), are built up in this order. Here, the layer thickness of the first magnetization fixation layer 4a is, for example, around 1.5 nm, and the layer thickness of the nonmagnetic intermediate layer 4b is around 0.5 nm, and the layer thickness of the second magnetization fixation layer 4c is around 2.5 nm. In this way, the first ferromagnetic layer 4 has a structure in which the nonmagnetic intermediate layer 4b of nonmagnetic property exists between the two ferromagnetic layers of the first magnetization fixation layer 4a and the second magnetization fixation layer 4c. However, as illustrated in the layer thickness of the three layers, the first ferromagnetic layer 4 includes the material of ferromagnetic property as a main material for the entire layer. Here, by exchange coupling produced in the boundary surface between the first magnetization fixation layer 4a and the antiferromagnetic layer 3, a magnetization direction of the first magnetization fixation layer 4a is fixed. On the other hand, exchange coupling also exists between the two layers of the first magnetization fixation layer 4a and the second magnetization fixation layer 4c with the nonmagnetic intermediate layer 4b interposed therebetween, and by this exchange coupling, a magnetization direction of the first magnetization fixation layer 4a and a magnetization direction of the second magnetization fixation layer 4c are maintained in a state in which they are antiparallel to each other. Therefore, by the above-described two types of exchange coupling, in the first ferromagnetic layer 4, a state in which the magnetization direction of the first fixation layer 4a and the magnetization direction the second fixation layer 4c are both fixed is realized. Alternatively, as the material of the nonmagnetic intermediate layer 4b, a material that includes rhodium (Rh) in addition to ruthenium (Ru) may also be employed. In such a case, it is preferable to include ruthenium in the amount of 5 atom % or more and 40 atom % or less, and further preferably, in the amount of 20 atom % or more and 30 atom % or less. Moreover, the thickness of the nonmagnetic intermediate layer 4b is preferably 0.3 nm or more and 0.7 nm or less, and further preferably, 0.4 nm or more and 0.7 nm or less.

The nonmagnetic layer 7 is a layer formed of a material including magnesium oxide (MgO). This nonmagnetic layer 7 is a layer whose magnetization ratio is fairly small and is also an electrically insulating layer. In this way, although the nonmagnetic layer 7 is an insulation layer, because the layer thickness is small, a tunnel current (current that passes through a potential barrier to flow due to Tunnel Effect of quantum mechanics) may flow through via the nonmagnetic layer 7 between the first nonmagnetic layer 4 located in the lower side of the nonmagnetic layer 7 and the second ferromagnetic layer 8 located in the upper side of the nonmagnetic layer 7. As for the layer thickness of the nonmagnetic layer 7, for example, around 1.0 nm to 1.5 nm may be employed. Here, due to the magnetoresistive effect (tunnel magnetoresistive effect), a magnitude of a resistance that the tunnel current that flows through via the nonmagnetic layer 7 between the first ferromagnetic layer 4 and the second ferromagnetic layer 8 receives becomes small when the magnetization of the first ferromagnetic layer 4 and the magnetization of the second ferromagnetic 8 are in the parallel state to each other and becomes large when the magnetization of the first ferromagnetic layer 4 and the magnetization of the second ferromagnetic layer 8 are antiparallel to each other.

The second ferromagnetic layer 8 is a layer of ferromagnetic property formed of a material (Co—Fe—B) including cobalt (Co), iron (Fe) and boron (B), and the thickness of the layer is approximately 3 nm. The magnetization of the second ferromagnetic layer 8 is different from that of the first magnetization fixation layer 4a and the second magnetization fixation layer 4c of the first ferromagnetic layer 4, and a magnetization direction thereof may be changed according to an external magnetic field. To be specific, according to whether the magnetization in each 1 bit area of the magnetic disk 50 of FIG. 3 approaching to the magnetic effect film 21 is oriented to a positive direction or a negative direction of the z-axis of FIG. 3, the magnetization of the second ferromagnetic layer 8 is oriented to either the positive direction or the negative direction of the z-axis in FIG. 2.

The surface protective layer 9 is a layer formed of a material including tantalum (Ta), and the thickness of the layer is, for example, around 3 nm.

This concludes the explanation about details of each layer of the magnetic effect film 21.

In the reproducing device 20 having the magnetic effect film 21 of FIG. 5, a magnetic domain control film 26 (described later) to bias a magnetization direction of the second ferromagnetic layer 8 is provided such that the magnetization of the second ferromagnetic layer 8 is oriented in a direction along the y-axis of FIG. 5 (that is, a positive direction or a negative direction of the y-axis. See FIG. 1 and FIG. 3 as well for the coordinate system) under a condition where there is no effect of an external magnetization to the reproducing device 20. On the other hand, the magnetization of the first magnetization fixation layer 4a and the magnetization of the second magnetization fixation layer 4c in the first ferromagnetic layer 4 are oriented in a direction along the z-axis of FIG. 5 (that is, a positive direction or a negative direction of the y-axis), due to the above-described exchange coupling with the antiferromagnetic layer 3, indifferently to the existence or nonexistence of an external magnetic field to the reproducing device 20.

The reproducing device 20 outputs a detection signal of the tunnel current flowing through between the first ferromagnetic layer 4 and the second ferromagnetic layer 8 when a voltage is applied between these two ferromagnetic layers. When the reproducing device 20 approaches to the 1 bit area of the magnetic disk 103, the reproducing device 20 is affected by a magnetic field generated by the magnetization of the 1 bit area (external magnetic field to the reproducing device 20) and the magnetization of the second ferromagnetic layer 8 is oriented in either the positive direction or the negative direction of the z-axis of FIG. 5 according to whether the magnetization of the 1 bit area is oriented in the positive direction or the negative direction of the z-axis of FIG. 5. The tunnel current flowing through between the first ferromagnetic layer 4 and the second ferromagnetic layer 8 is changed according to which direction the magnetization of the second ferromagnetic layer 8 is oriented in due to the above-described tunnel magnetoresistive effect, and thus the magnetization direction of each 1 bit area in the magnetic disk 103 is expressed by the detection signal from the reproducing device 20. This detection signal is the above-described reproducing signal, and in the magnetic disk 500 of FIG. 3, the reproducing device 20 in the magnetic head 51 generates a detection signal in this manner, thereby information is read.

The reproducing device 20 of FIG. 4 provided with the magnetoresistive effect film 21 in the above-described structure corresponds to one embodiment of the magnetoresistive effect device in the above-described basic mode, and a combination of the auxiliary underlayer 1c of FIG. 5, the lower shield layer 1b of FIG. 4 and the supporting substrate 1a of FIG. 4 corresponds to an example of the substrate in the basic mode.

In the reproducing device 20, by employing Ir—Mn as a material of the antiferromagnetic layer 3, while the layer thickness of the antiferromagnetic layer 3 is small, it is possible to generate sufficient exchange coupling to fix the magnetization direction of the first ferromagnetic 4 (specifically, the first magnetization fixation layer 4a), the reproducing device 20 may be a downsized reproducing device suitable for a high recording density.

Conventionally, as a material of the underlayer, an alloy made by combining some of nickel (Ni), iron (Fe), and chrome (Cr), ruthenium (Ru) or tantalum (Ta) is used. However, if an antiferromagnetic layer employing Ir—Mn is built up on an underlayer formed of the materials, Ir—Mn is oriented in a [111] plane oriented on the underlayer, so that a smooth layer is not obtained. If the first ferromagnetic layer, the nonmagnetic layer and the second ferromagnetic layer are built on the antiferromagnetic layer whose surface is uneven, these built layers also become layers lacking the evenness, and specifically because the nonmagnetic layer is thinner in comparison with other layers, it is easily affected by the unevenness of a boundary surface of the antiferromagnetic layer and tends to be a layer in a shape curling like a wave. If the nonmagnetic layer becomes such a curled shape, a magnetic field of the first ferromagnetic layer near the boundary surface of the nonmagnetic layer affects the magnetization of the second ferromagnetic layer, so that the responsiveness of the magnetization of the second ferromagnetic layer to the magnetic field of the 1 bit area which is a reading target is lowered. Furthermore, if the nonmagnetic layer becomes the curled shape, when a current flows through by a voltage applied between the first ferromagnetic layer and the second ferromagnetic layer, there is a possibility that the tolerance for voltage decreases and the nonmagnetic layer is broken. In this way, in a state where the responsiveness to an external magnetic field is low and the tolerance for voltage is also low, the reproducing device does not function sufficiently, thereby posing a problem.

In the reproducing device 20 of FIG. 4, when the underlayer 2 is formed of nitride copper (CuN), as will be described later in experiment results, in comparison with a case where the underlayer is formed by a conventionally used material such as an alloy formed of combining some of nickel (Ni), iron (Fe) and chrome (Cr), ruthenium (Ru) or tantalum (Ta), the unevenness is hardly generated on the surface of the antiferromagnetic layer 3 including Ir and Mn. Therefore, the first ferromagnetic layer 4, the nonmagnetic layer 7 and the second ferromagnetic layer 8 that are built on the antiferromagnetic layer 3 may be avoided to become a layer lacking the evenness and also may avoid, in each layer, a decrease of the responsiveness to the external magnetic field and a decrease of tolerance for voltage. As a result, in the reproducing device 20 of FIG. 4, the advantage of downsizing the reproducing device is fully exerted when iridium (Ir) and manganese (Mn) are employed as a material of the antiferromagnetic layer 3.

Here, a microscopic feature of nitride copper (CuN) in the underlayer 2 that makes it hard to produce unevenness on the surface of the antiferromagnetic layer 3 will be described. In nitride copper (CuN) in the underlayer 2, a crystal structure is formed by copper atom (Cu) and nitrogen atom (N), and in this crystal structure, a crystal plane with a Miller index [200] is in parallel with the surface of the support substrate 1a of FIG. 4 (more accurately, a surface of a combination of the auxiliary underlayer 1c of FIG. 5, the lower shield layer 1b of FIG. 4 and the support substrate 1a of FIG. 4). In the reproducing device 20 of FIG. 4, the alloy of Ir and Mn is built on the underlayer 2 such crystal-oriented to form a crystal structure, so that the antiferromagnetic layer 3 is formed. At this time, affected by the crystalline orientation of nitride copper (CuN) in the underlayer 2, also in the crystal structure of the alloy of Ir and Mn, crystalline orientation is produced such that the crystal plane with the Miller index [200] is in parallel with the surface of the support substrate 1a of FIG. 4 (more accurately, the surface of the combination of the auxiliary underlayer 1c of FIG. 5, the lower shield layer 1b of FIG. 4 and the support substrate 1a of FIG. 4). When the crystalline orientation of the alloy of Ir and Mn is produced in this manner, the stability of a geometry of the antiferromagnetic layer 3 is improved in a direction along the surface of the support substrate 1a of FIG. 4, so that unevenness is hardly produced on the surface of the antiferromagnetic layer 3.

Here, in the reproducing device 20 of FIG. 4, the underlayer 2 is built on the auxiliary underlayer 1c having the amorphous structure, and the crystal structure of nitride copper (CuN) is formed on this auxiliary underlayer 1c. Generally, in the amorphous, although there is not a long-distance order as such in a crystal, a short-distance order exists and therefore, orientation similar to that of the crystal exists. Therefore, by building the underlayer 2 on the above-described auxiliary underlayer 1c having an amorphous structure, the crystalline orientation of the underlayer 2 is easily aligned by an influence of the orientation of the amorphous layer.

Next, a manufacturing method of the reproducing device 20 of FIG. 4 will be explained.

Figure 6C:
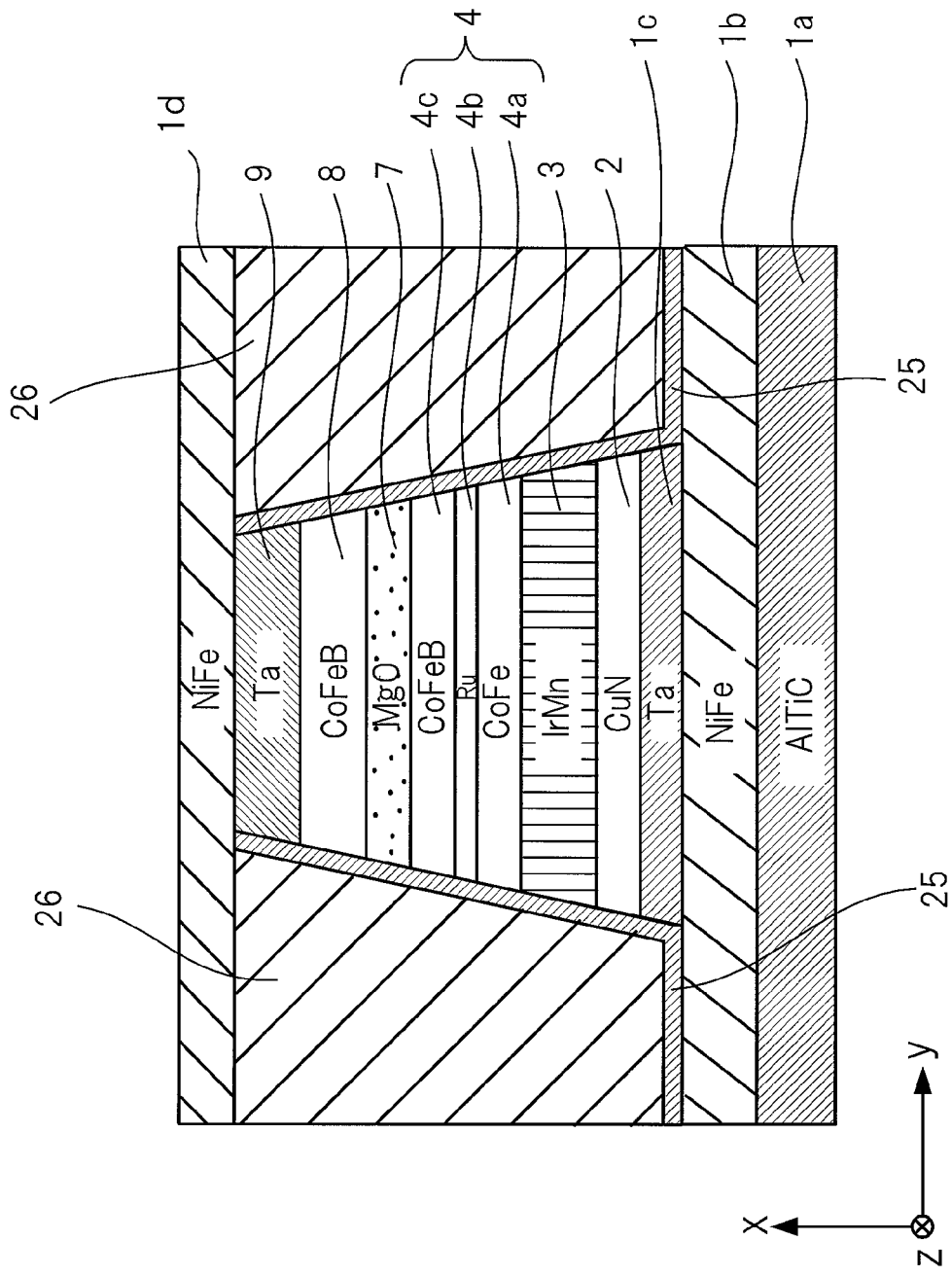

FIGS. 6A to 6C illustrate a state in each step until the reproducing device 20 in FIGS. 4A and 4B is produced.

Firstly, steps until the structure illustrated in FIG. 6A is produced will be explained. Firstly, an aluminum oxide film is formed on a surface of a nonmagnetic material including aluminum oxide ($Al_2O_3$) and carbonized titanium (TiC) to produce the support substrate 1a (AlTiC substrate). Next, on the support substrate 1a, the lower magnetic shield layer 1b is formed by sputtering, and further, on the lower magnetic shield layer 1b, the auxiliary underlayer 1c is formed also by sputtering. Then, as illustrated in FIG. 6A, each layer from the underlayer 2 to the second ferromagnetic layer 8 is sequentially formed on the auxiliary underlayer 1c and lastly, on the second ferromagnetic layer 8, the surface protective layer 9 is formed.

Next, steps until the structure illustrated in FIG. 6B is formed will be explained. At first, a part of the area in the surface protective layer 9 illustrated in FIG. 6A is covered with a resist pattern 49 by photolithography. While using this resist pattern 49 as a mask, each layer from the auxiliary underlayer 1c to the surface protective layer 9 is patterned by ion milling. At this time, in the area that is not covered with the resist pattern 49, a lower magnetic shield layer 22 is exposed. FIG. 6B illustrates a state in which the lower magnetic shield layer 22 is exposed on both sides of the layered structure in the shape of trapezoid in which each layer from the auxiliary underlayer 1c to the surface protective layer 9 is built.

Next, steps until the structure illustrated in FIG. 6C is formed will be explained.

An entire upper surface of the structure illustrated in FIG. 6B is covered by sputtering, for example, with an insulation film 25 formed of $Al_2O_3$ in the thickness of 3 nm to 10 nm. Further, the entire surface covered with the insulation film 25 is covered with the magnetic domain control film 26 by sputtering until the dent portion that is dented (for example, the both sides of the layer structure in the trapezoid shape in FIG. 6B) by being removed by the patterning is filled in. As a material of the magnetic domain control film 26, for example, an alloy (CoCrPt) formed of cobalt (Co), chrome (Cr) and platinum (Pt) is employed. Subsequently, the resist pattern 49 is removed together with the insulation film 25 and the magnetic domain control film 26 accumulated on the resist pattern 49. By this removal operation, only the magnetic domain control film 26 filling in both sides of the layered structure made of each layer from the auxiliary underlayer 1c to the surface protective layer 9 remains and the magnetic domain control film 26 covering the upper side of the layered structure is removed. The surface of the remaining magnetic domain control film 26 is smoothed out by Chemical Machine Polishing (CMP), to adjust so that the upper surface of the layered structure (surface of the surface protective layer 9) and the surface of the remaining magnetic domain control film 26 are smoothly joined. Lastly, on the surface of the surface protective layer 9 and the surface of the magnetic domain control film 26, the upper magnetic shield layer 23 is accumulated by the sputtering. With this, the reproducing device 20 having the structure illustrated in FIG. 6C is completed.

Here, in the structure illustrated in FIG. 6C, the magnetic domain control film 26 is heat-treated beforehand in a magnetic field so that a magnetization direction of the second ferromagnetic layer 8 is biased in the direction along the y-axis of FIG. 6C (positive direction or negative direction of the y-axis) under a state where there is no influence of external magnetic fields for the layered structure. On the other hand, the first magnetization fixation layer 4a and the second magnetization fixation layer 4c in the first ferromagnetic layer 4 are fixed so as to be oriented in a direction either in parallel or antiparallel with the z-axis of FIG. 6C, by devising a placement of the antiferromagnetic layer 3 in the yz-plane. To be specific, generally in the antiferromagnetic structure, spin of crystal lattices composing the antiferromagnetic structure is antiparallel to each other in a predetermined direction between the adjoining crystal lattices, and in the antiferromagnetic layer 3 of FIG. 6C, the antiferromagnetic layer 3 is formed such that the predetermined direction becomes the direction along the z-axis of FIG. 6C (direction parallel or antiparallel to the z-axis).

In the above explanation, nitride copper (CuN) is employed as the material of the underlayer 2. However, other than the nitride copper (CuN), when employing any nitride of titanium (Ti), magnesium (Mg), aluminum (Al), chrome (Cr), nickel (Ni), iron (Fe) and molybdenum (Mo), or employing a metal nitride combining some of these, the above-described effect of smoothing the antiferromagnetic layer 3 is also obtained. In such a reproducing device, a magnetic head, and a HDD that employs these metal nitride instead of the nitride copper (CuN) as the material of the underlayer 2 is obtained by replacing nitride copper (CuN) with one of the metal nitrides in the above explanation, hence detailed explanation is omitted here.

In the following, by using experiments, explanation will be made about the effect of smoothing, magnetic interaction between each layer, and a state of the crystal plane when a metal nitride is employed as the material of the underlayer.

[Experiment 1]

Hereafter, the experiment 1 will be explained.

Four pieces of samples are produced by changing a material of the underlayer. The sample includes, on a silicon substrate that is smoothed out by etching its surface, an auxiliary underlayer formed of Ta in the thickness of 3 nm and having the amorphous structure, an underlayer in the thickness of 4 nm, an antiferromagnetic layer formed of Ir—Mn in the thickness of 7 nm, a first magnetization fixation layer formed of Co—Fe in the thickness of 1.7 nm, a nonmagnetic intermediate layer formed of Ru in the thickness of 0.7 nm, and a second magnetization fixation layer formed of Co—Fe—B in the thickness of 2 nm, which are sequentially formed by sputtering. In the four pieces of samples, Ru, Ni—Fe, Cu and CuN are used as the material of the underlayer, respectively. Incidentally, in the sample that uses CuN in the underlayer, the underlayer is formed by sputtering using sputter gas in which a partial pressure ratio of argon gas and nitrogen gas is 1 to 4. For these four types of samples, an Atomic Force Microscope is used to obtain a standard deviation of unevenness (standard deviation of heights) and a difference of heights between the most protruding point and the most dented point (maximum difference of heights) on the surface of the Co—Fe—B layer.

Figure 7A:
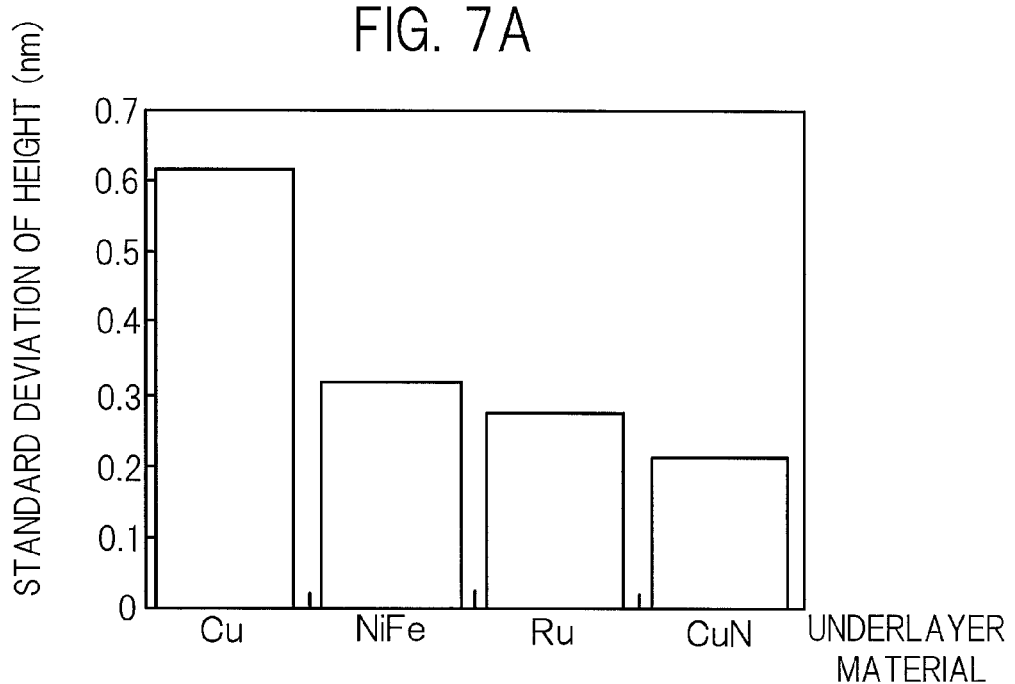
FIGS. 7A and 7B are diagrams illustrating a result of experiment 1.
Figure 7B:
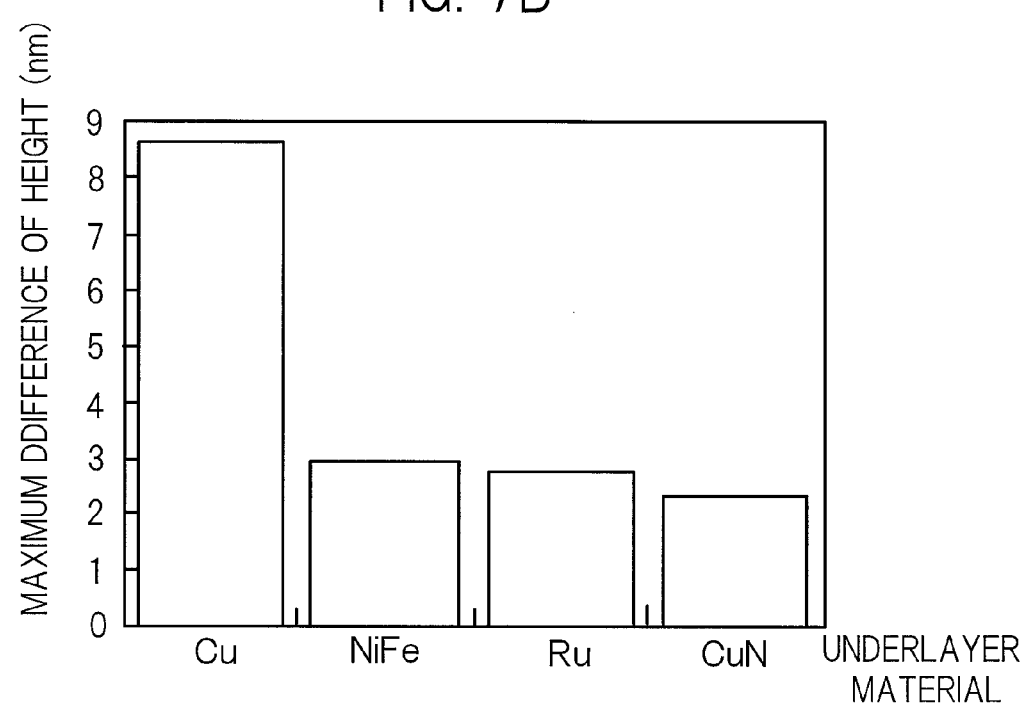

FIGS. 7A and 7B are diagrams illustrating a result of the experiment 1.

FIG. 7A illustrates a standard deviation (unit is nm) of heights for each of the four types of samples, and FIG. 7B illustrates a maximum difference of heights (unit is nm) for each of the four types of samples. As illustrated in FIGS. 7A and 7B, the sample using CuN in the underlayer indicates the smallest value for both the standard deviation of heights and the maximum difference of heights among the four types of samples, and it is found that when CuN is used in the underlayer, the effect of smoothing is high.

[Experiment 2]

Next, the experiment 2 will be explained.

The surface of the silicon substrate is smoothed out by etching and thereon, an auxiliary underlayer in which a Ta layer in the thickness of 5 nm, a CuN layer in the thickness of 20 nm, a Ta layer in the thickness of 3 nm, a CuN layer in the thickness of 20 nm and a Ta layer in the thickness of 3 nm are multilayered in this order. Further on this auxiliary underlayer, an underlayer formed of CuN in the thickness of 3 nm, an antiferromagnetic layer formed of Ir—Mn in the thickness of 7 nm, a first magnetization fixation layer formed of Co—Fe in the thickness of 1.7 nm, a nonmagnetic intermediate layer formed of Ru in the thickness of 0.68 nm, a second magnetization fixation layer formed of Co—Fe—B in the thickness of 2.5 nm, a nonmagnetic intermediate layer formed of MgO in the thickness of 1.0 nm to 1.5 nm, and a second ferromagnetic layer formed of Co—Fe—B in the thickness of 3 nm are sequentially formed. Furthermore on this second ferromagnetic layer, a surface protective layer in a three-layered structure made up of a TA layer in the thickness of 5 nm, a Cu layer in the thickness of 10 nm, and a Ru layer in the thickness of 10 nm is formed to produce a sample used in the experiment 2. Moreover, a sample that has the same layer structure as the above, however the thickness of the nonmagnetic layers are different from each other and falls in the range of 1.0 nm to 1.5 nm is produced. In this way, samples in which the thickness of the nonmagnetic layers are different are repeatedly produced to prepare plural samples in which the thickness of the nonmagnetic layer is different from each other and falls in the range of 1.0 nm to 1.5 nm are produced. These samples have a different area resistance, respectively, since the thickness of the nonmagnetic layers are different, and the thicker the nonmagnetic layer is, the larger the area resistance is.

Moreover, a sample having the same layer structure as the above-described layer structure except that Ru is used in the underlayer, is prepared in plural number of pieces by changing the thickness of the nonmagnetic layers similarly as the above.

Still more, a sample having the same layer structure as the above-described layer structure except that Ni—Fe is used in the underlayer, is prepared in plural number of pieces by changing the thickness of the nonmagnetic layer similarly as the above.

For each of the above-described samples, a MR ratio is obtained. Here, the MR ratio is obtained such that, for magnetization of the second ferromagnetic layer and magnetization of the second magnetization fixation layer, a resistance value of the nonmagnetic layer when a direction of these magnetization is in the antiparallel state, and a resistance value of the nonmagnetic layer when a direction of these magnetization is in the parallel state are obtained, then a difference between the resistance values is obtained, and then the difference is divided by the resistance value when a direction of these magnetization is in the parallel state to obtain a ratio, and the ratio is expressed as a percentage. The larger the MR ratio is, the greater the change of a resistance according to a direction of magnetization of the second ferromagnetic layer is, and therefore a magnetoresistive effect is great.

Figure 8:
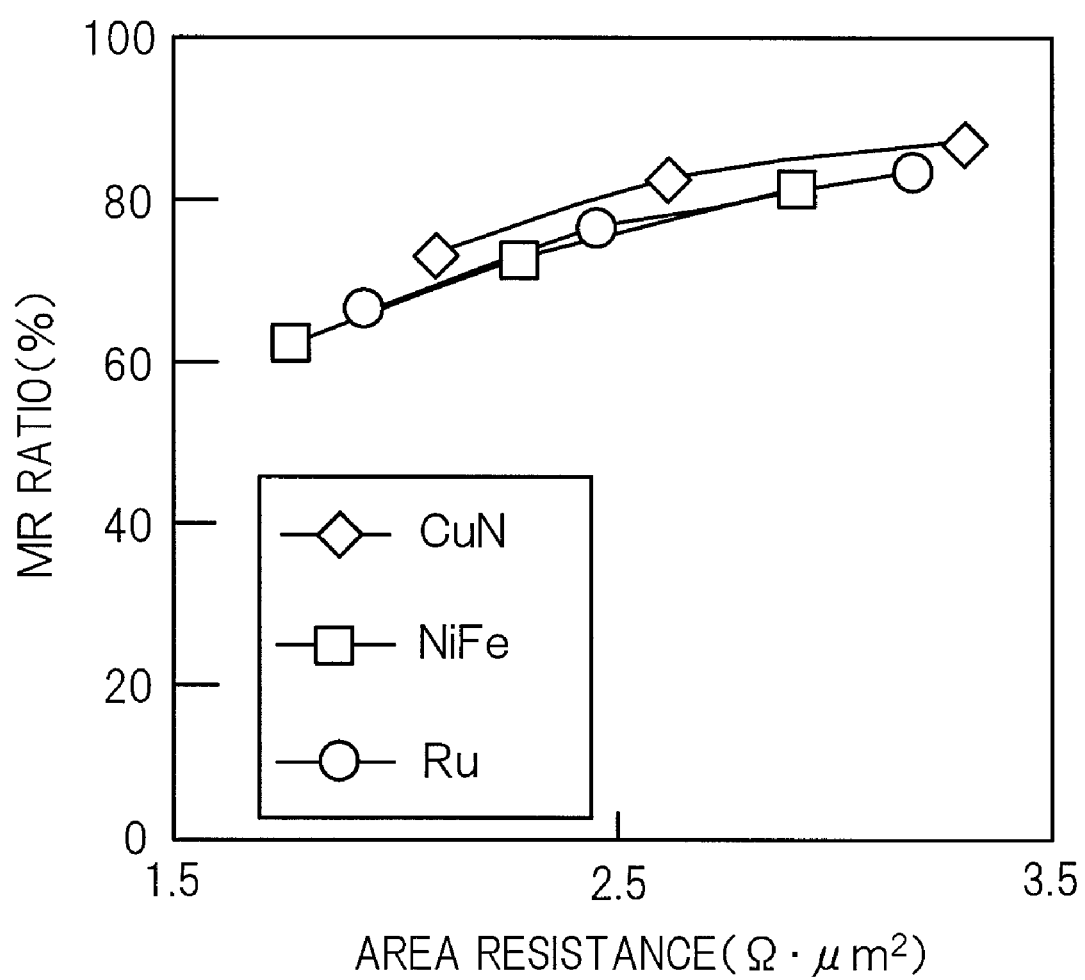
FIG. 8 is a diagram illustrating a result of experiment 2.

FIG. 8 is a diagram illustrating a result of the experiment 2.

FIG. 8 indicates graphs for samples in which CuN is used in the underlayer, in which Ru is used in the underlayer, and in which Ni—Fe is used in the underlayer, respectively, while designating area resistance (unit is $\Omega \cdot \mu m^2$) on the horizontal axis and MR ratio on the vertical axis (unit is %).

As illustrated in FIG. 8, a graph of the sample using CuN in the underlayer is above the other two graphs, indicating that by using CuN in the underlayer, a high magnetoresistive effect is obtained. Generally there appears a tendency that in a region where the area resistance is around 2.5 [$\Omega \cdot \mu m^2$] as illustrated in FIG. 8, the larger the area resistance is (namely, the thicker the nonmagnetic layer is), the larger the MR ratio is. For example, in FIG. 8, in either of the three graphs, the MR ratio increases monotonically with respect to the area resistance. By taking this tendency into consideration, as a reason that the graph of the sample using CuN in the underlayer is above the other two graphs as in FIG. 8, it is considered that in the underlayer of CuN, the effect of smoothing is high in comparison with other materials, which results in less twists and bends in the boundary surface of the nonmagnetic layer so that a same MR ratio is obtained with a smaller area resistance than the other materials.

[Experiment 3]

Next, experiment 3 will be explained.

In this experiment 3, in addition to plural samples using CuN in the underlayer each of which having a different area resistance from each other, plural samples using Ni—Fe in the underlayer each of which having a different area resistance from each other, and plural samples using Ru in the underlayer each of which having a different area resistance from each other, which are explained in the experiment 2, there are prepared plural samples using Cu in the underlayer each of which having a different area resistance from each other, plural samples using Ni—FeN in the underlayer each of which having a different area resistance from each other, and plural samples using CrN in the underlayer each of which having a different area resistance from each other. These samples have the same structure explained in FIG. 2 except that the material of the underlayer is different. These samples are formed such that by changing the thickness of the nonmagnetic layers, the area resistance becomes different from each other, similarly as in the experiment 2.

In the experiment 3, a magnetic field is applied to these samples externally, and a change of the MR ratio is examined when the external magnetic field is changed.

Parts (A) and (B) of FIG. 9 are diagrams explaining the experiment 3.

When the external magnetic field is changed for a sample having the above-described layer structure, in accordance with a change of value of magnetization of the second ferromagnetic layer which draws a hysteresis loop by magnetic hysteresis, a point designated by an external magnetic field and a MR ratio in the coordinate also changes while drawing a loop like a dotted line graph and a solid line graph in part (A) of FIG. 9 in the coordinate space of the external magnetic field and the MR ratio. In this experiment 3, for each sample in which a material of the underlayer is different from each other, an external magnetic field at the center point of the loop is obtained. For example, an external magnetic field Hin' at a center point B of the dotted line graph or an external magnetic field Hin at a center point A of the solid line graph in part (A) of FIG. 9 is an external magnetic field at the center point of the loop.

Supposing that the second ferromagnetic layer exists alone and isolated, a center of hysteresis loop representing a change of magnetization of the second ferromagnetic layer to the external magnetic field is a point at which both the external magnetic field and the magnetization become zero (namely, the origin). On the other hand, in the samples having the layer structure as in the experiment 2, the second ferromagnetic layer is also affected by the magnetic field generated by the magnetization of the second magnetization fixation layer, the center of the hysteresis loop is off the zero and the external magnetic field moves to a point at which the external magnetic field cancels magnetic field the magnetization of the second magnetization fixation layer generates. The external magnetic field at this cancellation point is the external magnetic field to give the central point of the hysteresis loop in the coordinate system of the external magnetic field and the MR ratio, like the Hin and the Hin' in part (A) of FIG. 9. Therefore, by obtaining the external magnetic field at the center point of the loop, the magnitude of the magnetic interaction between the second ferromagnetic layer and the second magnetization fixation layer is obtained. Here in the above samples, the second ferromagnetic layers are in the same thickness formed of the same material, so that the magnitude of saturation magnetization of the second ferromagnetic layers are the same. Because of this, a maximum value and a minimum of the MR ratio when the external magnetic field is changed are the same for any of the samples, and the MR ratio at the center point of the loop becomes a common value. Therefore, an interaction between the second ferromagnetic layer and the second magnetization fixation layer, which is desired to obtain the same MR ratio may be estimated by comparing the magnitude of the external magnetic field at the center point of the loop for samples having a uniform area resistance.

For example, of the Hin and Hin' in part (A) of FIG. 9, the Hin' is larger than the Hin and therefore, the sample corresponding to the graph in the dotted line requires larger interaction between the second ferromagnetic layer and the second magnetization fixation layer to obtain a same MR ratio than the sample corresponding to the graph in the solid line.

In part (B) of FIG. 9, graphs are illustrated, respectively, for the sample using Cu in the underlayer, for the sample using Ni—Fe in the underlayer, for the sample using Ru in the underlayer, for the sample using CuN in the underlayer, for the sample using Ni—FeN in the underlayer, and for the sample using CrN in the underlayer, while designating area resistance ($\Omega \cdot m^2$) on the horizontal axis and external magnetic field at the center point of the loop on the vertical axis.

As illustrated in part (B) of FIG. 9, a graph of the sample using CuN in the underlayer, a graph of the sample using Ni—FeN in the underlayer and a graph of the sample using CrN in the underlayer are drawn below a graph of the sample using Cu in the underlayer, a graph of the sample using Ni—Fe in the underlayer and a graph of the sample using Ru in the underlayer. It is found that, by using a metal nitride such as CuN, Ni—FeN and CrN in the underlayer, it is possible to cause a predetermined magnitude of coupling force (interaction) between the second ferromagnetic layer and the second magnetization fixation layer with a smaller area resistance. Here, since a distance between the second ferromagnetic layer and the second magnetization fixation layer is longer for a sample that has a thicker nonmagnetic layer and a larger area resistance, the interaction between the second ferromagnetic layer and the second magnetization fixation layer becomes smaller, therefore the magnitude of the external magnetic field at the center point of the loop becomes smaller. In fact, as in part (B) of FIG. 9, the six graphs corresponding to the above-described six types of materials of the underlayer indicate a monotonous decline for the area resistance. Considering this fact, as the reason why the graphs of samples using the metal nitrides such as CuN, Ni—Fe and CrN in the underlayer are drawn below the graphs of samples using Cu, Ni—Fe and Ru in the underlayer as illustrated in part (B) of FIG. 9, it is considered that the metal nitride has a great effect of smoothing in comparison with other materials, therefore twist and bending on the boundary surface of the nonmagnetic layer is reduced, and thus the area resistance desired to obtain the coupling force of a same magnitude is reduced.

[Experiment 4]

Next, the experiment 4 will be explained.

In this experiment, the flow rate of nitrogen gas that is added for nitride when producing a sample having CuN as a material of the underlayer is changed, which is explained in the experiment 1, thereby producing plural samples that are produced under a different flow rate of nitrogen gas. These samples are the same as the samples having CuN as the material of the underlayer explained in the experiment 1, except that the flow rate of the nitrogen gas is different. Then, an exchange cohesion Jex which is generated between the first magnetization fixation layer formed of Co—Fe and the antiferromagnetic layer formed of Ir—Mn is examined.

Further, when producing the sample having CuN as the material of the underlayer, which is explained in the experiment 1, while maintaining a partial pressure ratio of the argon gas and the nitrogen gas in the sputter gas constant at 3:7, plural samples in which the thickness of the underlayer (CuN film thickness) is different from each other are produced. These samples are the same as the samples having CuN as the material of the underlayer, which is explained in the experiment 1, except that the flow rate of the nitrogen gas is different and the thickness of the underlayer is different. Then, the exchange cohesion Jex which is generated between the first magnetization fixation layer formed of Co—Fe and the antiferromagnetic layer formed of Ir—Mn is examined.

FIGS. 10A and 10B are diagrams illustrating a result of the experiment 4.

In FIG. 10A, a result of plural samples formed under a different flow rate of the nitrogen gas to each other is illustrated, while designating a flow rate of the nitrogen ($N_2$) gas (the unit is sccm) on the horizontal axis and an exchange cohesion Jex (the unit is erg/cm$^2$) on the vertical axis. Furthermore in FIG. 10A, for a comparison purpose, a result of the exchange cohesion Jex is also illustrated for the sample having Cu as the material of the underlayer and the sample having Ru as the material of the underlayer, respectively. As illustrated in FIG. 10A, the exchange cohesion Jex of each sample having CuN as the material of the underlayer is small in comparison with the exchange cohesion Jex of the samples having Cu or Ru as the material of the underlayer, however, in any samples having CuN as the material of the underlayer, the exchange cohesion of 0.4 erg/cm$^2$ or more is obtained. In general, as the magnitude of the exchange cohesion generated between the first magnetization fixation layer and the antiferromagnetic layer, if there is 0.4 erg/cm$^2$ or more, then a magnetization direction of the first magnetization fixation layer is sufficiently fixed and capable of functioning fully as the magnetoresistive effect device. From the result of FIG. 10A, it is found that, when CuN is employed as the material of the underlayer, in comparison with a case where a material such as Cu and Ru which are conventionally used is employed, although the exchange cohesion is somewhat reduced, enough exchange cohesion may be exerted.

In FIG. 10B, a result of plural samples having a different layer thickness of CuN to each other is illustrated, while designating CuN film thickness (the unit is nm) on the horizontal axis and exchange cohesion Jex (the unit is erg/cm$^2$) on the vertical axis. As illustrated in FIG. 10B, in any of the CuN film thickness, the exchange cohesion Jex is 0.4 erg/cm$^2$ or more, and from this result, in different to the CuN film thickness, it is found that enough exchange cohesion may be generated between the first magnetization fixation layer and the antiferromagnetic layer.

[Experiment 5]

Next, the experiment 5 will be explained.

In this experiment, a sample forming an underlayer of CuN on the auxiliary underlayer having the amorphous structure is prepared, and a crystal orientation (Miller index) on the surface of the sample is examined by using an X-ray diffraction. The underlayer of CuN is formed by using sputtering that uses sputter gas including argon gas and nitrogen gas. In this experiment, the X-ray diffraction is performed to a sample having the underlayer formed by using sputter gas in which a flow rate of argon (Ar) gas is 15 sccm and a flow rate of nitrogen gas is 20 sccm, and to a sample having the underlayer formed by using sputter gas in which a flow rate of argon (Ar) gas is 15 sccm and a flow rate of nitrogen gas is 40 sccm. Furthermore, for a comparison purpose, a sample having the underlayer formed of Cu in place of the above-described underlayer formed of CuN is prepared, and the X-ray diffraction is performed to this sample as well. Here, an overview of the X-ray analysis performed here will be explained.

FIG. 11 is a diagram explaining an overview of the X-ray analysis.

In this X-ray analysis, an X-ray beam generated in the X-ray source 100 that generates a characteristic X ray (here, CuK α ray) is irradiated to a sample 400, and a reflection strength is measured by a counter 200. The sample 400 has the layered structure described in the explanation of the experiment 5 and is disposed on a fixation stage 300 so as to make the surface of the fixing stage and the surface of the underlayer parallel. This fixation stage 300 may be rotated with respect to a direction of the irradiation of the X-ray beam by a not illustrated mechanism, and the counter 200 also rotates in coordination with the rotation of the fixation stage 300. To be specific, as illustrated in FIG. 11, a rotation angle of the fixation stage 300 (that is, the irradiation angle of the X-ray beam) is θ, rotation of the fixation stage 300 and the counter 200 is performed to make a rotation angle of the counter 200 to become 2θ. In this X-ray analysis, a rotation angle at which the reflection strength of the X-ray is strong (a peak appears) due to Bragg reflection is obtained while changing the irradiation angle θ of the X-ray beam, thereby obtaining a crystal orientation (Miller index) of the plane parallel to the surface of the fixation stage for the crystal structure of the sample 400.

FIG. 12 is a diagram illustrating a result of the experiment 5.

FIG. 12 illustrates a result of the X-ray analysis about a sample having the underlayer of Cu and two types of samples having the underlayer of CuN in which a component of the nitrogen gas in the sputter gas is different from each other. In the sample having the underlayer of Cu, a peak of Miller index [111] plane appears and it is found that a plane parallel to the surface of the fixation stage has the Miller index [111] plane. On the other hand, in the two types of samples having the underlayer of CuN, a peak of Miller index [200] plane appears, and it is found that a plane parallel to the surface of the fixation stage has the Miller index [200] plane.

By this experiment, it is concluded that when CuN is employed as the material of the underlayer, a crystal plane of the underlayer surface is tend to become the crystal plane having the Miller index [200] plane.

[Experiment 6]

Next, the experiment 6 will be explained.

In this experiment, the underlayer is formed on the auxiliary underlayer having the amorphous structure, and on the underlayer, a sample in which an antiferromagnetic layer formed of Ir—Mn, a first magnetization fixation layer formed of Co—Fe, and a nonmagnetic layer formed of Ru are formed in this order is prepared, and a crystal orientation (Miller index) on the surface of the sample is examined by using the X-ray diffraction described in the experiment 5. Here, for the above-described samples, a sample employing Ni—CrN as a material of the underlayer, a sample employing Ru as a material of the underlayer, a sample employing CuN as a material of the underlayer, and a sample employing CrN as a material of the underlayer are prepared. Here, of the above-described samples, when forming each underlayer of Ni—CrN, CuN, and CrN, the flow rate of Ar gas in the sputter gas is set to 15 sccm and the flow rate of $N_2$ gas is set to 40 sccm to form the underlayers. Furthermore, in addition to these samples, Ni—CrN is employed as a material of the underlayer, and a sample is prepared by forming the underlayer such that the flow rate of Ar gas in the sputter gas is set to 5 sccm and the flow rate of $N_2$ gas is set to 50 sccm to form the underlayer.

FIG. 13 is a diagram illustrating a result of the experiment 6.

As illustrated in FIG. 13, in the sample using Ru as the material of the underlayer, a peak of [111] plane of Ir—Mn is clearly recognized. However, in contrast to this, in the samples using a metal nitride such as Ni—CrN, CuN, and CrN as a material of the underlayer, the peak of [111] plane of Ir—Mn does not appear and a peak of [200] plane of Ir—Mn appears. From this, it is concluded that by employing a metal nitride such as Ni—CrN, CuN, and CrN as a material of the underlayer, in the antiferromagnetic layer made of Ir—Mn formed on the underlayer, the Miller index is tend to become crystal plane with Miller index [200].

The above description is the explanation of the experiments about the effect of smoothing, magnetic interaction between each layer, and a state of crystal surface when a metal nitride is employed as a material of the underlayer.

Next, explanation will be made about a MRAM (Magnetoresistive Random Access Memory) that employs the magnetoresistive effect film 21 of FIG. 5 in a storage section storing information.

Parts (A) and (B) of FIG. 14 are diagrams illustrating a schematic structure of a MRAM having the magnetoresistive effect film 21 in FIG. 5.

In part (A) of FIG. 14, a cross-sectional view of the MRAM is illustrated. This MRAM has a structure such that a reading word line 82, a MOS transistor 83, a writing word line 88, a bit line 89, and the magnetoresistive effect film 21 of FIG. 5 are disposed on a silicon substrate 80.

The reading word line 82 and the writing word line 88 have one-to-one correspondence and extend in a direction perpendicular to part (A) of FIG. 14. On the other hand, the bit line 89 extends in a left- and right direction of part (A) of FIG. 14. The MOS transistor 83 is disposed at the intersection of the reading word line 82 and the bit line 89. Here, the reading word line 82 also serves as a gate electrode of the MOS transistor 83. That is, by a voltage supplied to the reading word line 82, a conducting state of the MOS transistor 83 is controlled.

The magnetoresistive effect film 21 is disposed at the intersection of the writing word line 88 and the bit line 89. In this MRAM, a magnetization direction of the second ferromagnetic layer 8 (see FIG. 5) of the magnetoresistive effect film 21 is changed due to the effect of the magnetic field by the current flowing in the writing word line 88 and the bit line 89. The underlayer 2 of the magnetoresistive effect film 21 (see FIG. 5) is connected to one of impurity diffusion regions 81 of the MOS transistor 83 via a wiring 87, plural plugs 84 penetrating through the multi-layered wiring layer and isolation wirings 85. Here, the surface protective layer 9 (see FIG. 5) of the magnetoresistive effect film 21 is connected to the bit line 89. That is, the wiring 87 and the bit line 89 serve as an electrode to flow a sense current to the magnetoresistive effect film 21 in the thickness direction thereof. The other impurity diffusion region 81 of the MOS transistor 83 is connected to a grounding wiring 86 via the plug 84.

In part (B) of FIG. 14, a diagram of an equivalent circuit of this MRAM is illustrated. As illustrated in this figure, the plural reading word lines 82 and the plural writing word lines 88 extend in the up and down direction of part (B) of FIG. 14. The plural bit lines 89 extend in left-and-right direction of part (B) of FIG. 14.

As illustrated in part (B) of FIG. 14, the magnetoresistive effect film 21 is disposed at the intersection of the bit line 89 and the writing word line 88, and the MOS transistor 83 is disposed at the intersection of the reading word line 82 and the bit line 89. One terminal of the magnetoresistive effect film 21 is connected to the corresponding bit line 89, and the other terminal of the MOS transistor 83 is connected to the other corresponding terminal. The other terminal of the MOS transistor 83 is grounded. Further, the gate electrode of the MOS transistor 83 is connected to the corresponding reading word line 82.

In the MRAM having the structure as explained above, by including the plural magnetoresistive effect film 21 in the structure of FIG. 5, information is stored in the form of the magnetization direction of the plural second ferromagnetic layers 8. In this MRAM as well, since the underlayer 2 of the magnetoresistive effect film 21 is formed of nitride copper (CuN), unevenness is hard to be generated on the surface of the antiferromagnetic layer 3 including Ir and Mn, and also as to each layer built up on the antiferromagnetic layer 3, a layer lacking in smoothness is avoided so that deterioration of responsiveness to the external magnetic field and tolerance for a voltage are avoided. As a result, in this MRAM, the advantage of Ir—Mn that the thickness of the antiferromagnetic layer may be reduced is fully utilized, and a downsized MRAM is obtained.

This concludes the explanation of the embodiments of the magnetoresistive effect device, the magnetic head and the information storage apparatus whose basic modes (and application modes) are described above.

In the above explanation, the first ferromagnetic layer of FIG. 5 has a three-layered structure composed of the first magnetization fixation layer, the nonmagnetic intermediate layer and the second fixed magnetization layer.

However, in the basic modes of the magnetoresistive effect device, the magnetic head and the information storage apparatus, the first ferromagnetic may be a single layer.

Moreover, in the above explanation, the magnetoresistive effect film 21 is a magnetoresistive effect film in which the nonmagnetic layer is made of the insulator MgO and which utilizes a tunnel magnetoresistive effect (TMR). However, in the basic modes of the magnetoresistive effect device, the magnetic head and information storage apparatus, the nonmagnetic layer may not be an insulator, and a magnetoresistive effect film utilizing a great magnetoresistive effect (GMR) may be employed.

All examples and conditional language recited herein are intended for pedagogical purposes to aid the reader in understanding the principles of the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiment(s) of the present invention(s) has (have) been described in detail, it should be understood that the various changes, substitutions, and alterations could be made hereto without departing from the spirit and scope of the invention.

What is claimed is:

1. A magnetoresistive effect device comprising:
    an underlayer, an antiferromagnetic layer, a first ferromagnetic layer, a nonmagnetic layer, and a second ferromagnetic layer which are multilayered in this order on a substrate,
    wherein the underlayer is formed of a metal nitride, and the antiferromagnetic layer is formed of an antiferromagnetic material including Ir and Mn,
    wherein the underlayer is formed of CuN, and
    wherein the underlayer formed of CuN is crystal-orientated such that a [200] crystal plane is in parallel with a surface of the substrate.

2. The magnetoresistive effect device according to claim 1, wherein the antiferromagnetic layer formed of Ir and Mn is crystal-orientated such that a [200] crystal plane is in parallel with a surface of the substrate.

3. The magnetoresistive effect device according to claim 2, wherein the nonmagnetic layer is formed of an insulative material and has a thickness to allow a tunnel current to flow through in a direction of the thickness.

4. The magnetoresistive effect device according to claim 2, wherein the first ferromagnetic layer is formed of at least two layers which are separated by a nonmagnetic layer, and magnetization directions of the separated ferromagnetic layers are coupled in antiparallel by exchange coupling.

5. The magnetoresistive effect device according to claim 1, wherein the nonmagnetic layer is formed of an insulative material and has a thickness to allow a tunnel current to flow through in a direction of the thickness.

6. The magnetoresistive effect device according to claim 5, wherein the insulative material is formed of MgO.

7. The magnetoresistive effect device according to claim 1, wherein the first ferromagnetic layer is formed of at least two layers which are separated by a nonmagnetic layer, and magnetization directions of the separated ferromagnetic layers are coupled in antiparallel by exchange coupling.

8. The magnetoresistive effect device according to claim 1, further comprising an amorphous layer between the substrate and the underlayer formed of CuN.

9. A magnetic head comprising:
a reproducing device that includes a magnetoresistive effect device in which an underlayer formed of CuN, an antiferromagnetic layer including Ir and Mn, a first ferromagnetic layer, a nonmagnetic layer, and a second ferromagnetic layer are multilayered in this order on substrate, wherein the underlayer is formed of CuN, and the underlayer formed of CuN is crystal-orientated such that a [200] crystal plane is in parallel with a surface of the substrate; and
a recording device that includes a thin film coil and a magnetic pole which a magnetic flux generated by the thin film coil goes through.

10. An information storage apparatus comprising:
a reproducing device that includes a magnetoresistive effect device in which an underlayer formed of CuN, an antiferromagnetic layer including Ir and Mn, a first ferromagnetic layer, a nonmagnetic layer, and a second ferromagnetic layer are multilayered in this order on substrate, wherein the underlayer is formed of CuN, and the underlayer formed of CuN is crystal-orientated such that a [200] crystal plane is in parallel with a surface of the substrate;
a magnetic head that includes a recording device having a thin film coil and a magnetic pole which a magnetic flux generated by the thin film coil goes through;
a storage reproducing medium to and from which information is recorded and reproduced by the magnetic head; and
a signal processing board that processes a recording signal and a reproducing signal to and from the storage reproducing medium.

* * * * *